(12) United States Patent
Lasserre

(10) Patent No.: US 12,327,386 B2
(45) Date of Patent: *Jun. 10, 2025

(54) METHODS AND DEVICES FOR BINARY ENTROPY CODING OF POINT CLOUDS

(71) Applicant: Malikie Innovations Limited, Dublin (IE)

(72) Inventor: Sébastien Lasserre, Thorigné-Fouillard (FR)

(73) Assignee: Malikie Innovations Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,213

(22) Filed: Feb. 12, 2024

(65) Prior Publication Data

US 2024/0185474 A1    Jun. 6, 2024

Related U.S. Application Data

(63) Continuation of application No. 17/280,753, filed as application No. PCT/EP2019/076711 on Oct. 2, 2019, now Pat. No. 11,900,641.

(30) Foreign Application Priority Data

Oct. 2, 2018 (EP) ..................... 18290113

(51) Int. Cl.
*G06T 9/40* (2006.01)
*G06F 17/18* (2006.01)
(Continued)

(52) U.S. Cl.
CPC ................ *G06T 9/40* (2013.01); *G06F 17/18* (2013.01); *G06T 9/001* (2013.01); *G06T 17/10* (2013.01);
(Continued)

(58) Field of Classification Search
CPC .......... G06T 9/40; G06T 9/001; G06T 17/10; H04N 19/105; H04N 19/13;
(Continued)

(56) References Cited

U.S. PATENT DOCUMENTS 5,742,892 A    4/1998    Chaddha
6,680,974 B1   1/2004    Faryar et al.
(Continued)

FOREIGN PATENT DOCUMENTS

CN    104040592 A    9/2014
CN    107403456 A    11/2017
(Continued)

OTHER PUBLICATIONS

Peng, Jingliang, et al.; "Geometry-Guided Progressive Lossless 3D Mesh Coding with Octree (OT) Decompsition"; AMC Trans. on Graphics; Jul. 2005; 8 pages.
(Continued)

*Primary Examiner* — Utpal D Shah
(74) *Attorney, Agent, or Firm* — Conley Rose, P.C.; J. Robert Brown, Jr.

(57) ABSTRACT

Methods and devices for encoding a point cloud. A bit sequence signalling an occupancy pattern for sub-volumes of a volume is coded using binary entropy coding. For a given bit in the bit sequence, a context may be based on a sub-volume neighbour configuration for the sub-volume corresponding to that bit. The sub-volume neighbour configuration depends on an occupancy pattern of a group of sub-volumes of neighbouring volumes to the volume, the group of sub-volumes neighbouring the sub-volume corresponding to the given bit. The context may be further based on a partial sequence of previously-coded bits of the bit sequence.

20 Claims, 33 Drawing Sheets

(51) Int. Cl.
| | |
|---|---|
| *G06T 9/00* | (2006.01) |
| *G06T 17/10* | (2006.01) |
| *H03M 7/30* | (2006.01) |
| *H04N 19/105* | (2014.01) |
| *H04N 19/13* | (2014.01) |
| *H04N 19/169* | (2014.01) |
| *H04N 19/46* | (2014.01) |
| *H04N 19/96* | (2014.01) |

(52) U.S. Cl.
CPC ....... *H03M 7/6005* (2013.01); *H03M 7/6011* (2013.01); *H04N 19/105* (2014.11); *H04N 19/13* (2014.11); *H04N 19/1883* (2014.11); *H04N 19/46* (2014.11); *H04N 19/96* (2014.11)

(58) Field of Classification Search
CPC .... H04N 19/1883; H04N 19/46; H04N 19/96; G06F 17/18; H03M 7/6005; H03M 7/6011
See application file for complete search history.

(56) References Cited

U.S. PATENT DOCUMENTS

| | | | |
|---|---|---|---|
| 8,942,282 | B2 | 1/2015 | Karczewicz et al. |
| 9,111,333 | B2 | 8/2015 | Jiang et al. |
| 10,032,309 | B2 | 7/2018 | Jiang et al. |
| 11,010,928 | B2 | 5/2021 | Mammou et al. |
| 11,206,426 | B2 * | 12/2021 | Sugio .................... H04N 19/46 |
| 11,308,651 | B2 | 4/2022 | Hur et al. |
| 11,417,030 | B2 * | 8/2022 | Zhang .................... G06T 9/001 |
| 11,450,031 | B2 * | 9/2022 | Flynn ...................... G06T 9/001 |
| 11,514,611 | B2 * | 11/2022 | Mammou ................. G06T 9/00 |
| 11,552,651 | B2 * | 1/2023 | Mammou ............ H04N 19/436 |
| 11,620,767 | B2 | 4/2023 | Lasserre et al. |
| 11,741,638 | B2 | 8/2023 | Flynn et al. |
| 11,861,869 | B2 | 1/2024 | Lasserre et al. |
| 11,900,641 | B2 | 2/2024 | Lasserre |
| 12,165,371 | B2 | 12/2024 | Lasserre et al. |
| 12,169,952 | B2 | 12/2024 | Flynn et al. |
| 2002/0150164 | A1 | 10/2002 | Felts et al. |
| 2003/0214502 | A1 | 11/2003 | Park et al. |
| 2007/0120712 | A1 | 5/2007 | Cai et al. |
| 2009/0167763 | A1 | 7/2009 | Waechter et al. |
| 2009/0202160 | A1 * | 8/2009 | Kim ........................ G06T 17/20 382/233 |
| 2011/0249721 | A1 | 10/2011 | Karczewicz et al. |
| 2011/0310976 | A1 | 12/2011 | Wang et al. |
| 2012/0014457 | A1 | 1/2012 | He et al. |
| 2012/0081242 | A1 | 4/2012 | He et al. |
| 2014/0184430 | A1 | 7/2014 | Jiang et al. |
| 2014/0303944 | A1 | 10/2014 | Jiang et al. |
| 2014/0376827 | A1 * | 12/2014 | Jiang ..................... G06T 17/205 382/238 |
| 2015/0010056 | A1 | 1/2015 | Choi et al. |
| 2015/0030081 | A1 | 1/2015 | Kim et al. |
| 2016/0047903 | A1 | 2/2016 | Dussan |
| 2017/0214943 | A1 | 7/2017 | Cohen et al. |
| 2017/0347100 | A1 | 11/2017 | Chou et al. |
| 2017/0347122 | A1 | 11/2017 | Chou et al. |
| 2018/0137224 | A1 | 5/2018 | Hemmer et al. |
| 2019/0080483 | A1 | 3/2019 | Mammou et al. |
| 2021/0004992 | A1 | 1/2021 | Flynn et al. |
| 2021/0004993 | A1 * | 1/2021 | Sugio ......................... G06T 9/40 |
| 2021/0099697 | A1 * | 4/2021 | Sugio .................... H04N 19/597 |
| 2021/0343046 | A1 | 11/2021 | Lasserre |
| 2022/0277517 | A1 | 9/2022 | Yano et al. |

FOREIGN PATENT DOCUMENTS

| | | | |
|---|---|---|---|
| EP | 1321894 | B2 | 6/2003 |
| EP | 2838260 | A1 | 2/2015 |
| JP | 2014532945 | A | 12/2014 |
| JP | 2017126890 | A | 7/2017 |
| KR | 100446635 | B1 | 9/2004 |
| KR | 20130010124 | A | 1/2013 |
| KR | 20140089426 | A | 7/2014 |
| WO | 2009044282 | A2 | 4/2009 |
| WO | 2011103678 | A1 | 9/2011 |
| WO | 2013065702 | A1 | 5/2013 |
| WO | 2013067673 | A1 | 5/2013 |
| WO | 2018059946 | A1 | 4/2018 |
| WO | 2019146691 | A1 | 8/2019 |
| WO | 2019240215 | A1 | 6/2021 |

OTHER PUBLICATIONS

Hornung, Armin, et al.; "OctoMap: An Efficient Probabilistic 3D Mapping Framework Based on Octrees"; Autonomous Robots; 2013; 17 pages.
Lasserre, Sebastien, et al.; "Neighbour-Dependent Entropy Coding of Occupancy Patterns in TMC3"; ISO/IEC JTC1/SC29/WG11 MPEG2018/m42238; Jan. 2018; 12 pages.
Budagavi, Madhukar; "Occupancy Map Coding Simplification in TMC2"; ISO/IEC JTC1/SC29/WG11 MPEG2018/ m42172; Jan. 2018; 6 pages.
Zakharchenko, Vladyslav, et al.; "Point Cloud Compression Core Experiment 3"; ISO/IEC JTC1/SC29/WG11 MPEG2018/w17347; Jan. 2018; 6 pages.
Mammmou, Khaled; "PCC Test Model Category 3 v1"; ISO/IEC JTC1/SC29/WG11 N17349; Jan. 2018; 8 pages.
Lasserre, Sebastien, et al.; "[PCC] A Binary Entropy Coder for Geometry Coding in TM3"; ISO/IEC JTC1/SC29/ WG11 MPEG2018/ m42522; Apr. 2018; 4 pages.
Office Action dated Sep. 13, 2023; U.S. Appl. No. 17/280,750; Mar. 26, 2021; 49 pages.
Notice of Allowance dated Feb. 16, 2024; U.S. Appl. No. 17/280,750; Mar. 26, 2021; 19 pages.
Office Action dated Jul. 5, 2023; U.S. Appl. No. 17/280,753, filed Mar. 26, 2021; 45 pages.
Notice of Allowance dated Sep. 28, 2023; U.S. Appl. No. 17/280,753, filed Mar. 26, 2021; 11 pages.
Notice of Allowance dated May 19, 2022; U.S. Appl. No. 16/955,513, filed Jun. 18, 2020; 23 pages.
Office Action dated May 12, 2022; U.S. Appl. No. 17/045,771, filed Oct. 7, 2020; 33 pages.
Notice of Allowance dated Oct. 5, 2022; U.S. Appl. No. 17/045,771, filed Oct. 7, 2020; 10 pages.
PCT International Search Report & Written Opinion of the International Searching Authority; PCT/EP2019/076710; Nov. 22, 2019; 14 pages.
European Extended Search Report; Application No. 18290112.4; May 23, 2019; 9 pages.
European Examination Report; Application No. 18290112.4; Mar. 11, 2021; 5 pages.
Chinese Office Action; Application No. 201980065237.9; Jul. 27, 2023; 16 pages.
Japanese Office Action; Application No. 2021-517937; Oct. 13, 2023; 5 pages.
Korean Office Action; Application No. 10-2021-7010900; Nov. 29, 2023; 5 pages.
PCT International Search Report & Written Opinion of the International Searching Authority; PCT/EP2019/076711; Nov. 25, 2019; 14 pages.
European Extended Search Report; Application No. 18290113.2; May 23, 2019; 9 pages.
European Extended Search Report; Application No. 21195127.2; Dec. 1, 2021; 10 pages.
Chinese Office Action; Application No. 201980065224.1; Jul. 26, 2023; 18 pages.
Japanese Office Action; Application No. 2021-517945; Oct. 13, 2023; 3 pages.
Korea Office Action; Application No. 10-2021-7010901; Nov. 29, 2023; 5 pages.
PCT International Search Report & Written Opinion of the International Searching Authority; PCT/CA2019/050039; Mar. 28, 2019; 7 pages.

(56) References Cited

OTHER PUBLICATIONS

European Extended Search Report; Application No. 18305037.6; Jun. 29, 2018; 8 pages.
European Examination Report; Application No. 18305037.6; Mar. 11, 2021; 6 pages.
European Extended Search Report; Application No. 21192137.4; Dec. 8, 2021; 11 pages.
Japanese Office Action; Application No. 2020-555094; Jan. 10, 2023; 5 pages.
European Extended Search Report; Application No. 23169774.9; Jul. 20, 2023; 7 pages.
Lasserre, Sebastien; U.S. Appl. No. 18/750,557, filed Jun. 21, 2024; Title: Methods and Devices for Binary Entropy Coding of Point Clouds; 83 pages.
Lasserre, Sebastien; U.S. Appl. No. 19/020,475, filed Jan. 14, 2025; Title: Methods and Devices for Binary Entropy Coding of Point Clouds; 89 pages.
Flynn, David, et al.; U.S. Appl. No. 18/979,860, filed Dec. 13, 2024; Title: Methods and Devices for Entropy Coding Point Clouds; 40 pages.
Notice of Allowance dated Apr. 14, 2023; U.S. Appl. No. 17/889,476, filed Aug. 17, 2022; 16 pages.
Office Action dated Apr. 11, 2024; U.S. Appl. No. 18/220,986, filed Jul. 12, 2023; 24 pages.
Notice of Allowance dated Aug. 5, 2024; U.S. Appl. No. 18/220,986 filed Jul. 12, 2023; 11 pages.
Office Action dated Apr. 13, 2023; U.S. Appl. No. 18/069,466, filed Dec. 21, 2022; 10 pages.
Notice of Allowance dated Jun. 15, 2023; U.S. Appl. No. 18/069,466, filed Dec. 21, 2022; 19 pages.
Office Action dated May 1, 2024; U.S. Appl. No. 18/466,919, filed Sep. 14, 2023; 14 pages.
Notice of Allowance dated Aug. 21, 2024; U.S. Appl. No. 18/466,919 filed Sep. 14, 2023; 5 pages.
Korean Office Action; Application No. 10-2020-7023063; Apr. 27, 2023; 5 pages.
European Extended Search Report; Application No. 23160508.0; Jun. 15, 2023; 11 pages.
European Extended Search Report; Application No. 18305415.4; Dec. 4, 2018; 9 pages.
European Examination Report; Application No. 18305415.4; Dec. 11, 2020; 11 pages.
Korean Office Action; Application No. 10-2020-7031930; May 15, 2023; 22 pages.
Chinese Office Action; Application No. 201980009159.0; May 5, 2023; 15 pages. (copy provided in related parent application).
Chinese Office Action; Application No. 201980039083.6; Aug. 26, 2023; 18 pages. (copy provided in related parent application).
European Extended Search Report; Application No. 24216927.4; Apr. 3, 2025; 10 pages.

* cited by examiner $$H(b_0, b_1, b_2, \ldots b_7 | N) \Rightarrow H(b_0 | N) \, H(b_1 | N, b_0) \, H(b_2 | N, b_0 b_1) \ldots H(b_7 | N, b_0 b_1 b_2 \ldots b_6)$$

FIG. 21

ID FOR BINARY
METHODS AND DEVICES FOR BINARY ENTROPY CODING OF POINT CLOUDS

CROSS-REFERENCE TO RELATED APPLICATIONS

This application is a continuation of U.S. patent application Ser. No. 17/280,753 filed Mar. 26, 2021 by Sébastien Lasserre entitled, "Methods and Devices for Binary Entropy Coding of Point Clouds", which is a U.S. National Stage of International Patent Application No. PCT/EP2019/076711 filed Oct. 2, 2019, which claims priority to EP Application No. 18290113.2 filed Oct. 2, 2018, all of which are incorporated by reference herein as if reproduced in their entireties.

FIELD

The present application generally relates to point cloud compression and, in particular to methods and devices for binary entropy coding of point clouds.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds. Moreover, it would be advantageous to find methods and devices for coding point clouds that can be implemented using context-adaptive binary entropy coding without requiring the management of an excessive number of contexts.

BRIEF DESCRIPTION OF THE DRAWINGS

Reference will now be made, by way of example, to the accompanying drawings which show example embodiments of the present application, and in which:

FIG. 21 illustrates the equivalence between non-binary coding and cascaded binary coding for an occupancy pattern;

Similar reference numerals may have been used in different figures to denote similar components.

DESCRIPTION OF EXAMPLE EMBODIMENTS

Figure 1:
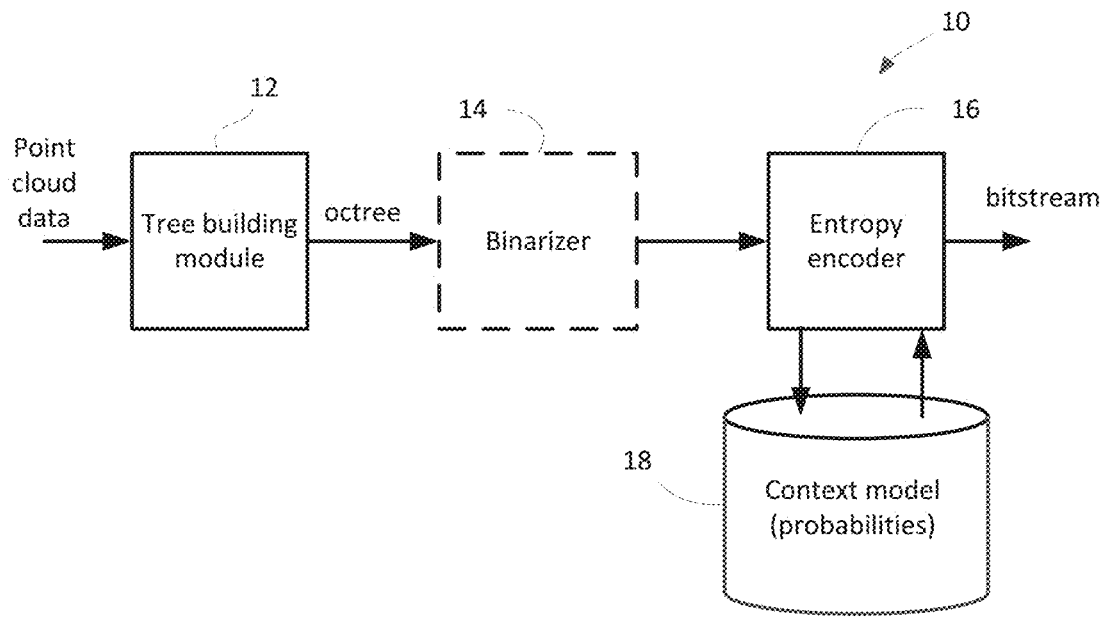
FIG. 1 shows a simplified block diagram of an example point cloud encoder.

The present application describes methods of encoding and decoding point clouds, and encoders and decoders for encoding and decoding point clouds. A bit sequence signalling an occupancy pattern for sub-volumes of a current volume may be coded using entropy coding (e.g., binary entropy coding). Probabilities for entropy coding (e.g., contexts) may be based on a neighbour configuration of the current volume and a partial sequence of previously-coded bits of the bit sequence. These probabilities may be further based on occupancy data for sub-volumes of at least one neighbouring volume of the current volume. In particular, the probability for coding a bit in the bit sequence may be selected based at least in part on a sub-volume neighbour configuration that depends on an occupancy pattern of a group of sub-volumes of the at least one neighbouring volume that neighbour that sub-volume of the current volume that corresponds to the bit in the bit sequence.

In examples that are useful for understanding the application, a determination may be made as to whether to apply a context reduction operation and, if so, the operation reduces the number of available contexts. Example context reduction operations include reducing neighbour configurations based on shielding by sub-volumes associated with previously-coded bits, special handling for empty neighbour configurations, and statistics-based context consolidation. The reduction may be applied in advance of coding and a determination may be made during coding as to whether the circumstances for using a reduced context set are met.

In one aspect, the present application provides a method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, wherein occupancy of sub-volumes of a volume is indicated using a bit sequence with each bit of the bit sequence indicating occupancy of a respective sub-volume in a scan order within the volume, and wherein a volume has a plurality of neighbouring volumes. The method includes, for a current node associated with a current volume split into sub-volumes, wherein each sub-volume corresponds to a child node of the current node, determining the bit sequence indicating the occupancy of the sub-volumes of the current volume. The method further includes, for at least one bit in the bit sequence of the current volume, determining, based on occupancy data for sub-volumes of at least one neighbouring volume of the current volume, a sub-volume neighbour configuration that depends on an occupancy pattern of a group of sub-volumes of the at least one neighbouring volume that neighbour that sub-volume of the current volume that corresponds to the bit in the bit sequence. The method further includes selecting a probability (e.g., context) for use in entropy encoding of the bit in the bit sequence, wherein the selecting is based at least in part on the sub-volume neighbour configuration. The method further includes entropy encoding the bit in the bit sequence based on the selected probability using a binary entropy encoder to produce encoded data for the bitstream.

Another aspect relates to a method of decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud, wherein occupancy of sub-volumes of a volume is indicated using a bit sequence with each bit of the bit sequence indicating occupancy of a respective sub-volume in a scan order within the volume, and wherein a volume has a plurality of neighbouring volumes. The method includes, for a current node associated with a current volume split into sub-volumes, wherein each sub-volume corresponds to a child node of the current node, and for at least one bit in the bit sequence of the current volume, determining, based on occupancy data for sub-volumes of at least one neighbouring volume of the current volume, a sub-volume neighbour configuration that depends on an occupancy pattern of a group of sub-volumes of the at least one neighbouring volume that neighbour that sub-volume of the current volume that corresponds to the bit in the bit sequence. The method further includes selecting a probability (e.g., context) for use in entropy decoding of the bit in the bit sequence, wherein the selecting is based at least in part on the sub-volume neighbour configuration. The method further includes entropy decoding said at least one bit based on the selected probability using a binary entropy decoder to produce a reconstructed bit from the bitstream.

In some implementations, determining the sub-volume neighbour configuration may involve determining the number of sub-volumes of the at least one neighbouring volume that neighbour that sub-volume of the current volume that corresponds to the bit in the bit sequence based on the occupancy data for the sub-volumes of the at least one neighbouring volume of the current volume. Said determining may further involve applying a threshold function to the determined number.

In some implementations, the sub-volume neighbour configuration of a given sub-volume in a given volume may correspond to a pattern of occupancy of sub-volumes in neighbouring volumes of the given volume that neighbour the given sub-volume.

In some implementations, determining the sub-volume neighbour configuration may be based on occupancy data for sub-volumes of those neighbouring volumes of the current volume that have already been coded.

In some implementations, selecting the probability may be further based on a partial sequence of bits of the bit sequence that have already been coded and/or a neighbouring configuration of the current volume. The neighbouring configuration of the current volume may correspond to a pattern of occupancy of the neighbouring volumes of the current volume.

In some implementations, determining the sub-volume neighbour configuration may involve determining all those sub-volumes of the at least one neighbouring volume that intersect that sub-volume of the current volume that corresponds to the bit in the bit sequence based on the occupancy data for the sub-volumes of the at least one neighbouring volume of the current volume. Said determining may further involve applying respective weight factors to the determined sub-volumes, wherein each weight factor depends on an intersection of the respective determined sub-volume with that sub-volume of the current volume that corresponds to the bit in the bit sequence. Said determining may further involve determining a weighted number of sub-volumes of the at least one neighbouring volume intersecting that sub-volume of the current volume that corresponds to the bit in the bit sequence based on the determined sub-volumes and their respective weight factors.

In some implementations, the scan order within the current volume for determining the bit sequence indicating the occupancy pattern may be determined so that, from one sub-volume to the next sub-volume in the scan order, the maximum possible number of neighbouring sub-volumes in already coded neighbouring volumes of the current volume does not increase.

In some implementations, the occupancy data of the sub-volumes of a given neighbouring volume of the current volume may include occupancy statuses for each of the sub-volumes of the given neighbouring volume.

In some implementations, the tree structure may represent an octree.

In some implementations, the method of encoding may further include encoding a flag indicating that the probability for use in entropy encoding of at least one bit has been selected at least in part based on the sub-volume neighbour configuration.

In some implementations, the method of decoding may further include decoding a flag from the bitstream, the flag indicating that the probability for use in entropy decoding of at least one bit should be selected at least in part based on the sub-volume neighbour configuration.

In another aspect, the present application provides a method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, wherein occupancy of sub-volumes of a volume is indicated using a bit sequence with each bit of the bit sequence indicating occupancy of a respective sub-volume in a scan order within the volume, and wherein a volume has a plurality of neighbouring volumes, a pattern of occupancy of the neighbouring volumes being a neighbour configuration. The method includes, for at least one bit in the bit sequence of the volume, determining that a context reduction condition is met and, on that basis, selecting a reduced context set that contains fewer contexts than the product of a count of neighbour configurations and a number of previously-coded bits in the sequence; selecting, for coding the at least one bit, a context from the reduced context set based on an occupancy status of at least some of the neighbouring volumes and at least one previously-coded bit of the bit sequence; entropy encoding the at least one bit based on the selected context using a binary entropy encoder to produce encoded data for the bitstream; and updating the selected context.

In another aspect, the present application provides a method of decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud, wherein occupancy of sub-volumes of a volume is indicated using a bit sequence with each bit of the bit sequence indicating occupancy of a respective sub-volume in a scan order within the volume, and wherein a volume has a plurality of neighbouring volumes, a pattern of occupancy of the neighbouring volumes being a neighbour configuration. The method of decoding includes, for at least one bit in the bit sequence of the volume, determining that a context reduction condition is met and, on that basis, selecting a reduced context set that contains fewer contexts than the product of a count of neighbour configurations and a number of previously-coded bits in the sequence; selecting, for coding the at least one bit, a context from the reduced context set based on an occupancy status of at least some of the neighbouring volumes and at least one previously-coded bit of the bit sequence; entropy decoding the at least one bit based on the selected context using a binary entropy decoder to produce a reconstructed bit from the bitstream; and updating the selected context.

In some implementations, the context reduction condition may include determining that one or more previously-coded occupancy bits is associated with one or more respective sub-volumes positioned between the sub-volume associated with the at least one bit and the one or more of the neighbouring volumes. In some cases this may include determining that four sub-volumes associated with previously-encoded bits share a face with a particular neighbour volume.

In some implementations, the context reduction condition may include determining that at least four bit of the bit sequence have been previously coded.

In some implementations, determining that the context reduction condition is met may include determining that the pattern of occupancy of the neighbouring volumes indicates that the plurality of neighbouring volumes is unoccupied. In some of those cases, the selected reduced context set may include a number of contexts corresponding to the number of previously-coded bits in the bit sequence and, optionally, selecting the context may include selecting the context based on a sum of previously-coded bits in the bit sequence.

In some implementations, the context reduction condition may include determining that at least a threshold number of bits in the bit sequence have been previously-coded, and the reduced context set may include a look-up table mapping each possible combination of neighbour configuration and pattern of previously-coded bits in the bit sequence to the fewer contexts. In some examples, the look-up table may be generated based on an iterative grouping of available contexts into a plurality of classes on the basis of determining that a distance measurement between respective pairs of available contexts is less than a threshold value, and each class in the plurality of classes may include a respective context in the smaller set, and there may be an available contexts for each the possible combination of neighbour configuration and pattern of previously-coded bits in the bit sequence.

In some implementations, at least some of the neighbouring volumes are neighbouring volumes that share at least one face with the volume.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

The present application further describes computer-implemented applications, including topography application, cartography applications, automotive industry applications, autonomous driving applications, virtual reality applications, and cultural heritage applications, etc. These computer-implemented applications include processes of receiving a data stream or data file, unpacking the data stream or data file to obtain a bitstream of compressed point cloud data, and decoding the bitstream as described in the above aspects and its implementations. Thereby, these computer-implemented applications make use of a point cloud compression technique according to aspects and their implementations described throughout the present application.

The present application further describes methods of encoding and decoding point clouds, and encoders and decoders for encoding and decoding point clouds. In some implementations, a receiving unit receives multiplexed data which is obtained by multiplexing coded point cloud data with other coded data types such as metadata, image, video, audio and/or graphics. The receiving unit comprises a demultiplexing unit to separate the multiplexed data into coded point data and other coded data, and at least one decoding unit (or decoder) to decode the coded point cloud data. In some other implementations, an emitting unit emits multiplexed data which is obtained by multiplexing coded point cloud data with other coded data types such as metadata, image, video, audio and/or graphics. The emitting unit comprises at least one encoding unit (or encoder) to encode the point cloud data, and a multiplexing unit to combine coded point cloud data and other coded data into the multiplexed data.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where splitting implies occupancy, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the pattern for a sub-volume. Predictions may be spatial (dependent on previously coded sub-volumes in the same point cloud) or temporal (dependent on previously coded point clouds in a time-ordered sequence of point clouds).

Figure 2:
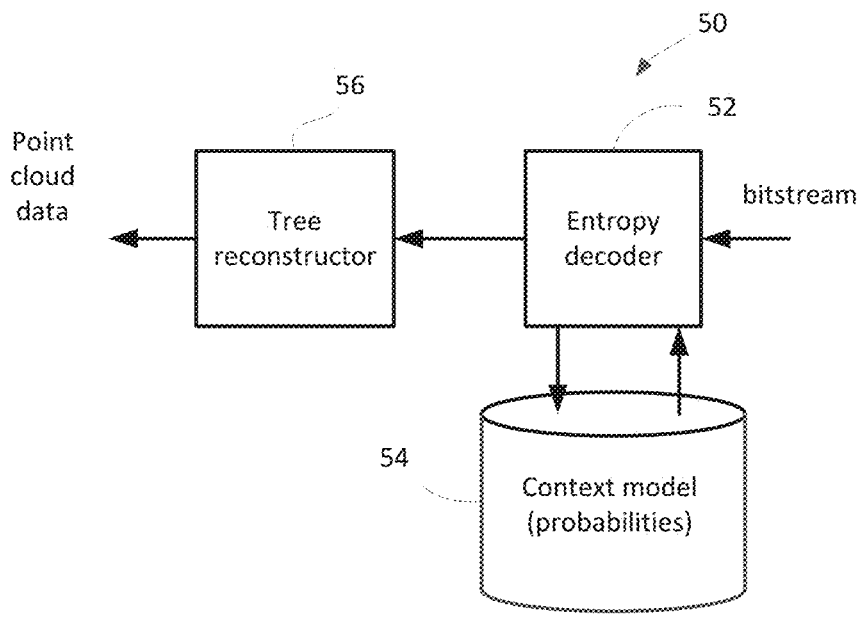
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
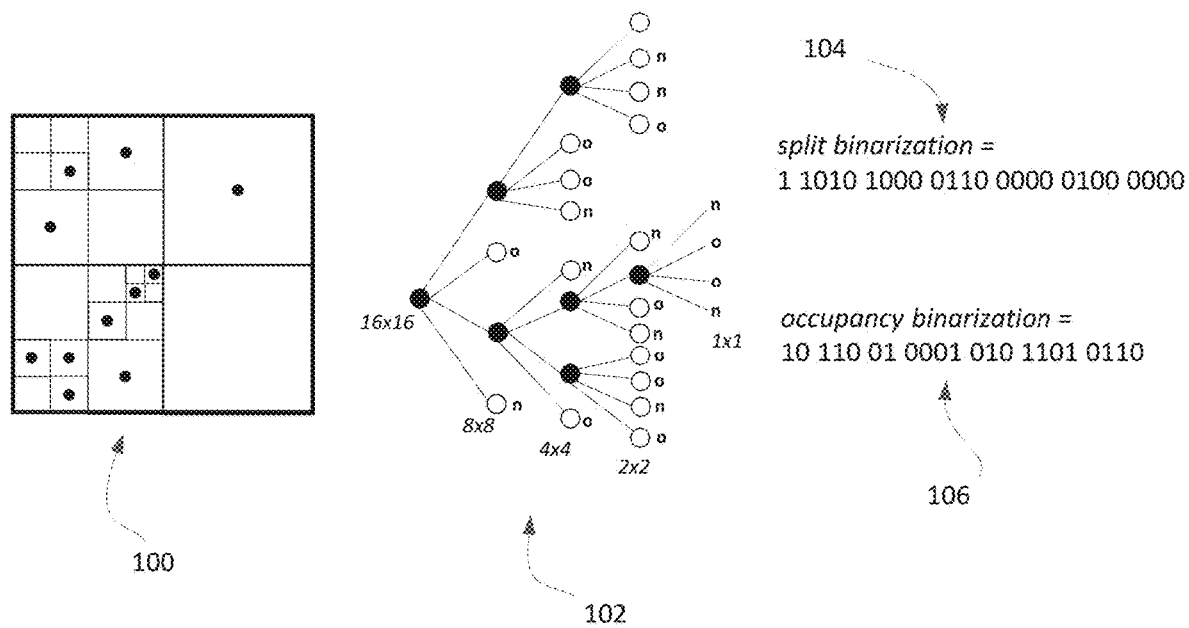
FIG. 3 shows an example partial sub-volume and associated tree structure for coding.

An example partial sub-volume 100 is shown in FIG. 3. In this example, a sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded.

Figure 4:
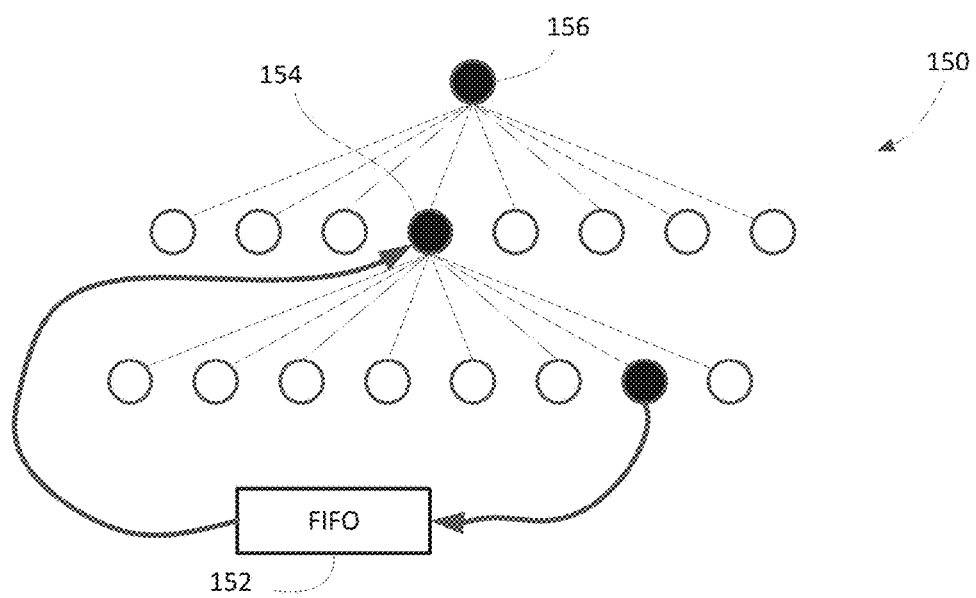
FIG. 4 illustrates the recursive splitting and coding of an octree.

Another example, which employs an occupied=splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

Figure 5:
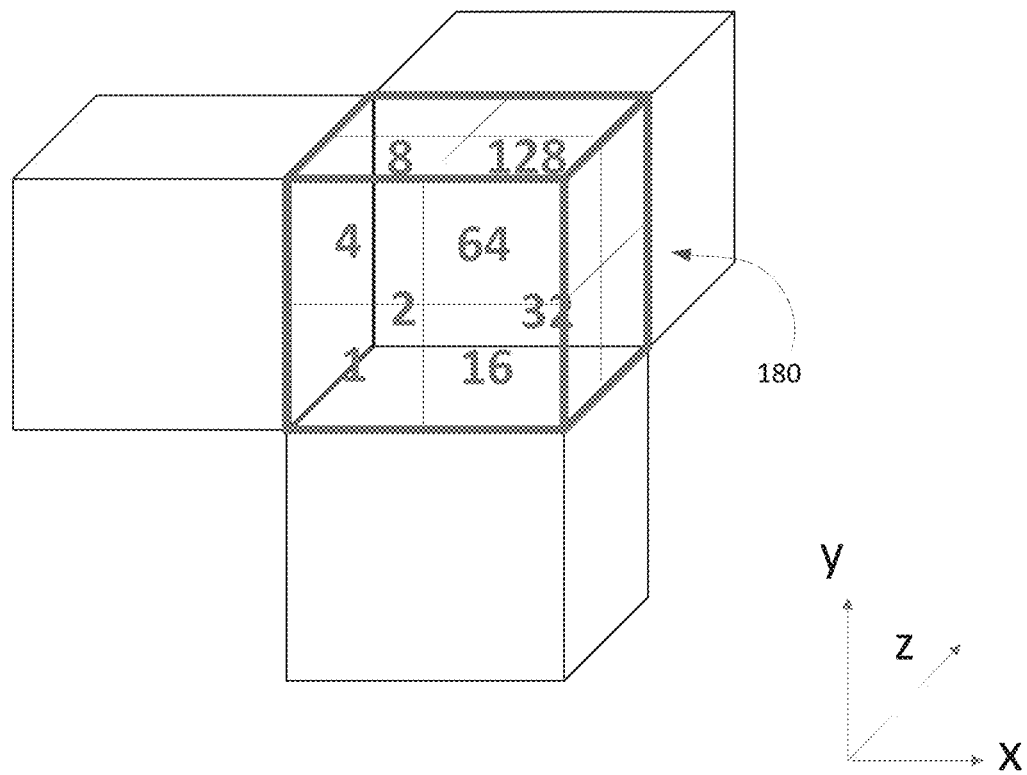
FIG. 5 shows an example scan pattern within an example cube from an octree.

Reference is now made to FIG. 5, which shows an example cube 180 from an octree. The cube 180 is subdivided into eight sub-cubes. The scan order for reading the flags results in an eight bit string, which can be read as an integer [1, 255] in binary. Based on the scan order and the resulting bit position of each sub-cube's flag in the string, the sub-cubes have the values shown in FIG. 5. The scan order may be any sequence of the sub-cubes, provided both the encoder and decoder use the same scan order.

Figure 6:
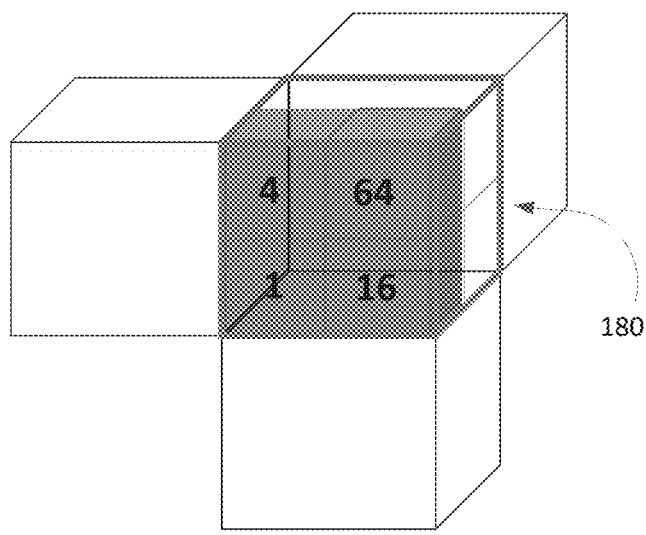
FIG. 6 shows an example occupancy pattern within an example cube.

As an example, FIG. 6 shows the cube 180 in which the four "front" sub-cubes are occupied. This would correspond to pattern 85, on the basis that the sub-cubes occupied are cubes 1+4+16+64. The integer pattern number specifies the pattern of occupancy in the sub-cubes.

An octree representation, or more generally any tree representation, is efficient at representing points with a spatial correlation because trees tend to factorize the higher order bits of the point coordinates. For an octree, each level of depth refines the coordinates of points within a sub-volume by one bit for each component at a cost of eight bits per refinement. Further compression is obtained by entropy coding the split information, i.e. pattern, associated with each tree node. This further compression is possible because the pattern distribution is not uniform—non-uniformity being another consequence of the correlation.

One potential inefficiency in current systems is that the pattern distribution (e.g. the histogram of pattern numbers seen in previously-coded nodes of the tree) is developed over the course of coding the point cloud. In some cases, the pattern distribution may be initialized as equiprobable, or may be initialized to some other pre-determined distribution; but the use of one pattern distribution means that the context model does not account for, or exploit, local geometric correlation.

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node. The contents of European patent application no. 18305037.6 are incorporated herein by reference.

Figure 7:
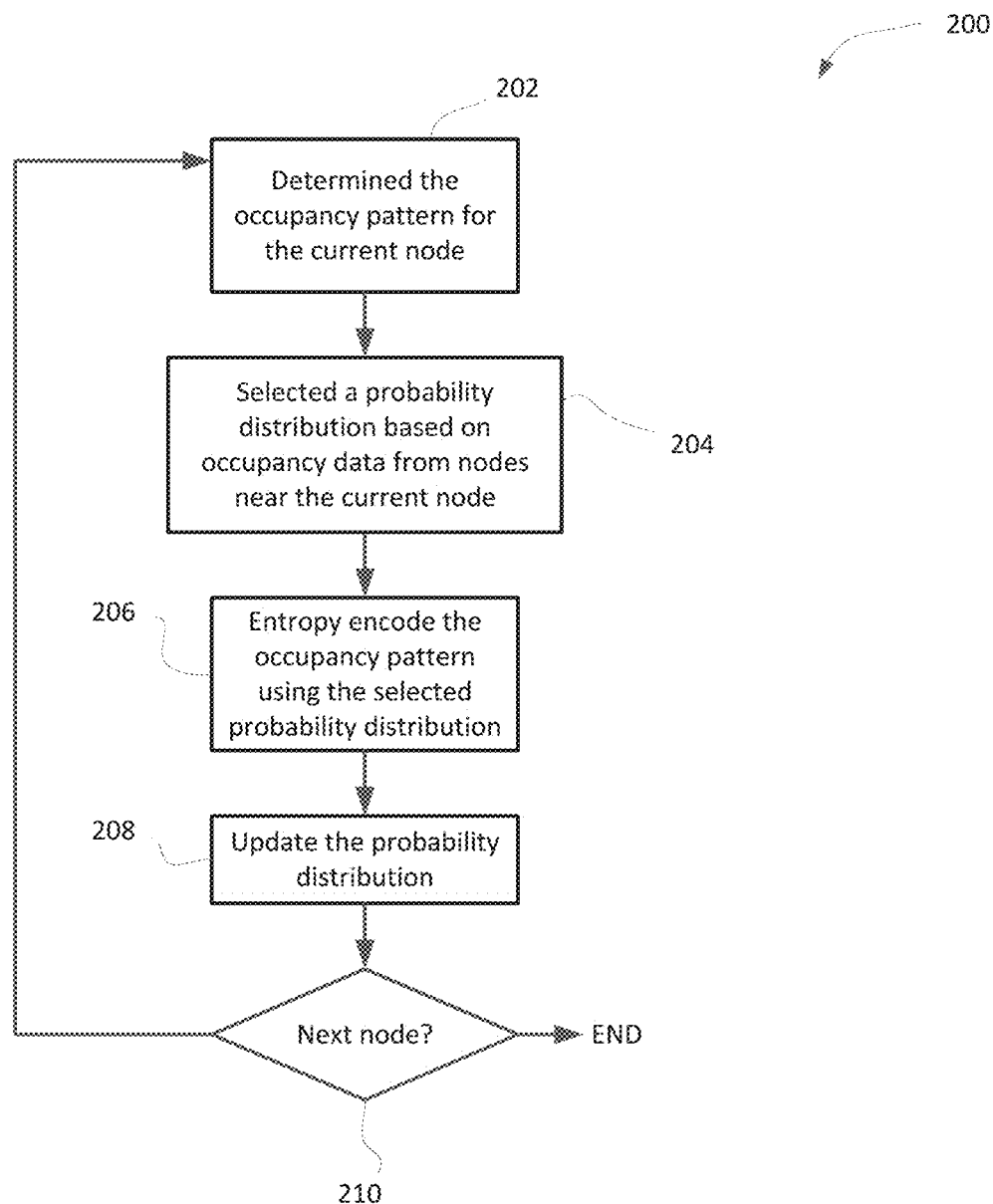
FIG. 7 shows, in flowchart form, one example method for encoding a point cloud.

Reference is now made to FIG. 7, which shows, in flowchart form, one example method 200 of encoding a point cloud. The method 200 in this example involves recursive splitting of occupied nodes (sub-volumes) and a breadth-first traversal of the tree for coding.

In operation 202, the encoder determines the pattern of occupancy for the current node. The current node is an occupied node that has been split into eight child nodes, each corresponding to a respective sub-cube. The pattern of occupancy for the current node specifies the occupancy of the eight child nodes in scan order. As described above, this pattern of occupancy may be indicated using an integer between 1 and 255, e.g. an eight-bit binary string.

In operation 204, the encoder selects a probability distribution from among a set of probability distributions. The selection of the probability distribution is based upon some occupancy information from nearby previously-coded nodes, i.e. at least one node that is a neighbour to the current node. Two nodes are neighbouring, in some embodiments, if they are associated with respective sub-volumes that share at least one face. In a broader definition, nodes are neighbouring if they share at least one edge. In yet a broader definition, two nodes are neighbouring if they share at least one vertex. The parent pattern within which the current node is a child node, provides occupancy data for the current node and the seven sibling nodes to the current node. In some implementations, the occupancy information is the parent pattern. In some implementations, the occupancy information is occupancy data for a set of neighbour nodes that include nodes at the same depth level of the tree as the current node, but having a different parent node. In some cases, combinations of these are possible. For example, a set of neighbour nodes may include some sibling nodes and some non-sibling nodes.

Once the probability distribution has been selected, the encoder then entropy encodes the occupancy pattern for the current node using the selected probability distribution, as indicated by operation 206. It then updates the selected probability distribution in operation 208 based on the occupancy pattern, e.g. it may increment the count corresponding to that occupancy pattern. In operation 210, the encoder evaluates whether there are further nodes to code and, if so, returns to operation 202 to code the next node.

Figure 8:
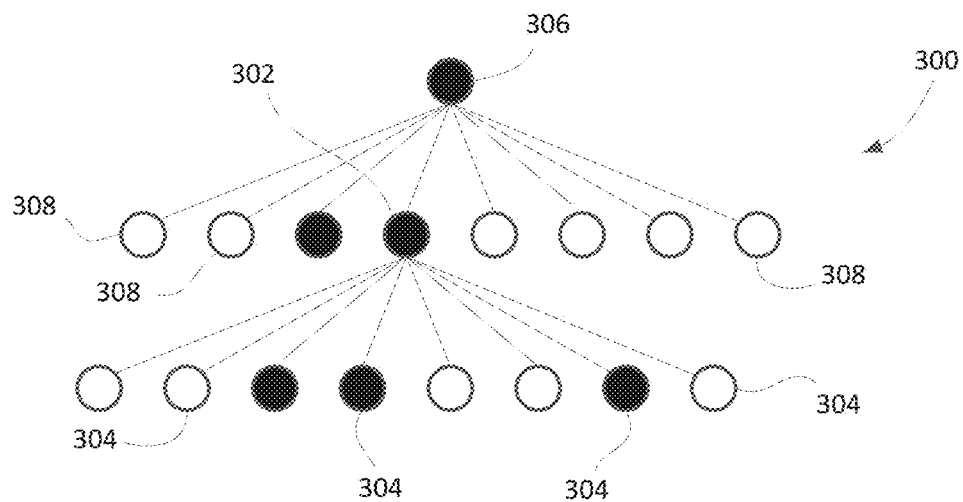
FIG. 8 illustrates a portion of an example octree.

The probability distribution selection in operation 204 is to be based on occupancy data for nearby previously-coded nodes. This allows both the encoder and decoder to independently make the same selection. For the below discussion of probability distribution selection, reference will be made to FIG. 8, which diagrammatically illustrates a partial octree 300, including a current node 302. The current node 302 is an occupied node and is being evaluated for coding. The current node 302 is one of eight children of a parent node 306, which in turn is a child to a grand-parent node (not shown). The current node 302 is divided into eight child nodes 304. The occupancy pattern for the current node 302 is based on the occupancy of the child nodes 304. For example, as illustrated, using the convention that a black dot is an occupied node, the occupancy pattern may be 00110010, i.e. pattern 50.

The current node 302 has sibling nodes 308 that have the same parent node 306. The parent pattern is the occupancy pattern for the parent node 306, which as illustrated would be 00110000, i.e. pattern 48. The parent pattern may serve as the basis for selecting a suitable probability distribution for entropy encoding the occupancy pattern for the current node.

Figure 9:
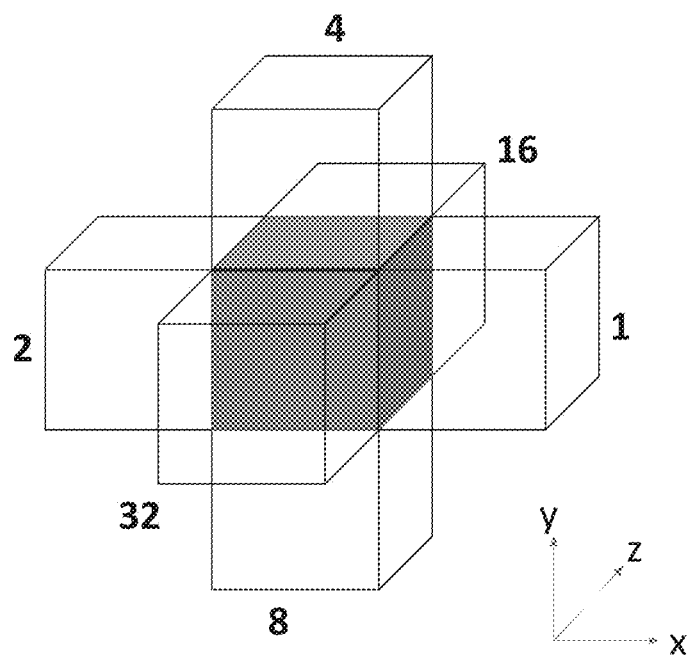
FIG. 9 shows an example of neighbouring sub-volumes.

FIG. 9 illustrates a set of neighbours surrounding a current node, where neighbour is defined as nodes sharing a face. In this example, the nodes/sub-volumes are cubes and the cube at the center of the image has six neighbours, one for each face. In an octree, it will be appreciated that neighbours to the current node will include three sibling nodes. It will also include three nodes that do not have the same parent node. Accordingly, occupancy data for some of the neighbouring nodes will be available because they are siblings, but occupancy data for some neighbouring nodes may or may not be available, depending on whether those nodes were previously coded. Special handling may be applied to deal with missing neighbours. In some implementations, the missing neighbour may be presumed to be occupied or may be presumed to be unoccupied. It will be appreciated that the neighbour definition may be broadened to include neighbouring nodes based on a shared edge or based on a shared vertex to include additional adjacent sub-volumes in the assessment.

It will be appreciated that the foregoing processes look at the occupancy of nearby nodes in an attempt to determine the likelihood of occupancy of the current node 302 so as to select more suitable context(s) and use more accurate probabilities for entropy coding the occupancy data of the current node 302. It will be understood that the occupancy status of neighbouring nodes that share a face with the current node 302 may be a more accurate assessment of whether the current node 302 is likely to be isolated or not than basing that assessment on the occupancy status of sibling nodes, three of which will only share an edge and one of which will only share a vertex (in the case of an octree). However, the assessment of occupancy status of siblings has the advantage of being modular in that all the relevant data for the assessment is part of the parent node, meaning it has a smaller memory footprint for implementation, whereas assessment of neighbour occupancy status involves buffering tree occupancy data in case it is needed when determining neighbour occupancy status in connection with coding a future nearby node.

Figure 10:
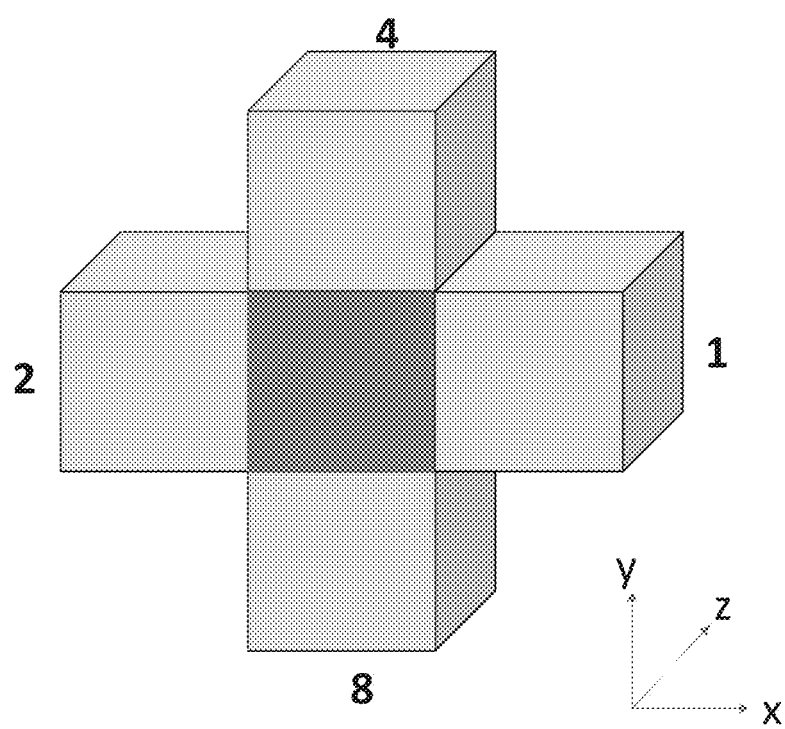
FIG. 10 shows an example neighbour configuration showing occupancy among neighbouring nodes.

The occupancy of the neighbours may be read in a scan order that effectively assigns a value to each neighbour, much like as is described above with respect to occupancy patterns. As illustrated, the neighbouring nodes effectively take values of 1, 2, 4, 8, 16 or 32, and there are therefore 64 (0 to 63) possible neighbour occupancy configurations. This value may be termed the "neighbour configuration" herein. As an example, FIG. 10 illustrates an example of neighbour configuration 15, in which neighbours 1, 2, 4 and 8 are occupied and neighbours 16 and 32 are empty.

In some cases, the two above criteria (parent pattern and neighbour configuration) may be both applied or may be selected between. For example, if neighbours are available then the probability distribution selection may be made based on the neighbouring nodes; however, if one or more of the neighbours are unavailable because they are from nodes not-yet coded, then the probability distribution selection may revert to an analysis based on sibling nodes (parent pattern).

In yet another embodiment, the probability distribution selection may alternatively, or additionally, be based on the grandparent pattern. In other words, the probability distribution selection may be based on the occupancy status of the uncle nodes that are siblings to the parent node 306.

In yet further implementation, additional or alternative assessments may be factored into the probability distribution selection. For example, the probability distribution selection may look at the occupancy status of neighbour nodes to the parent node, or neighbour nodes to the grand-parent node.

Any two or more of the above criteria for assessing local occupancy status may be used in combination in some implementations.

In the case of a non-binary entropy coder, the occupancy data for the current node may be coded by selecting a probability distribution. The probability distribution contains a number of probabilities corresponding to the number of possible occupancy patterns for the current node. For example, in the case of coding the occupancy pattern of an octree, there are $2^8-1=255$ possible patterns, meaning each probability distribution includes 255 probabilities. In some embodiments, the number of probability distributions may equal the number of possible occupancy outcomes in the selection criteria, i.e. using neighbour, sibling, and/or parent occupancy data. For example, in a case where a parent pattern for an octree is used as the selection criteria for determining the probability distribution to use, there would be 255 probability distributions involving 255 probabilities each. In the case of neighbour configuration, if neighbour is defined as sharing a face, there would be 64 probability distributions with each distribution containing 255 probabilities.

It will be understood that too many distributions may result in slow adaptation due to scarcity of data, i.e. context dilution. Accordingly, in some embodiments, similar patterns may be grouped so as to use the same probability distribution. For example separate distributions may be used for patterns corresponding to fully occupied, vertically-oriented, horizontally-oriented, mostly empty, and then all other cases. This could reduce the number of probability distributions to about five. It will be appreciated that different groupings of patterns could be formed to result in a different number of probability distributions.

Figure 11:
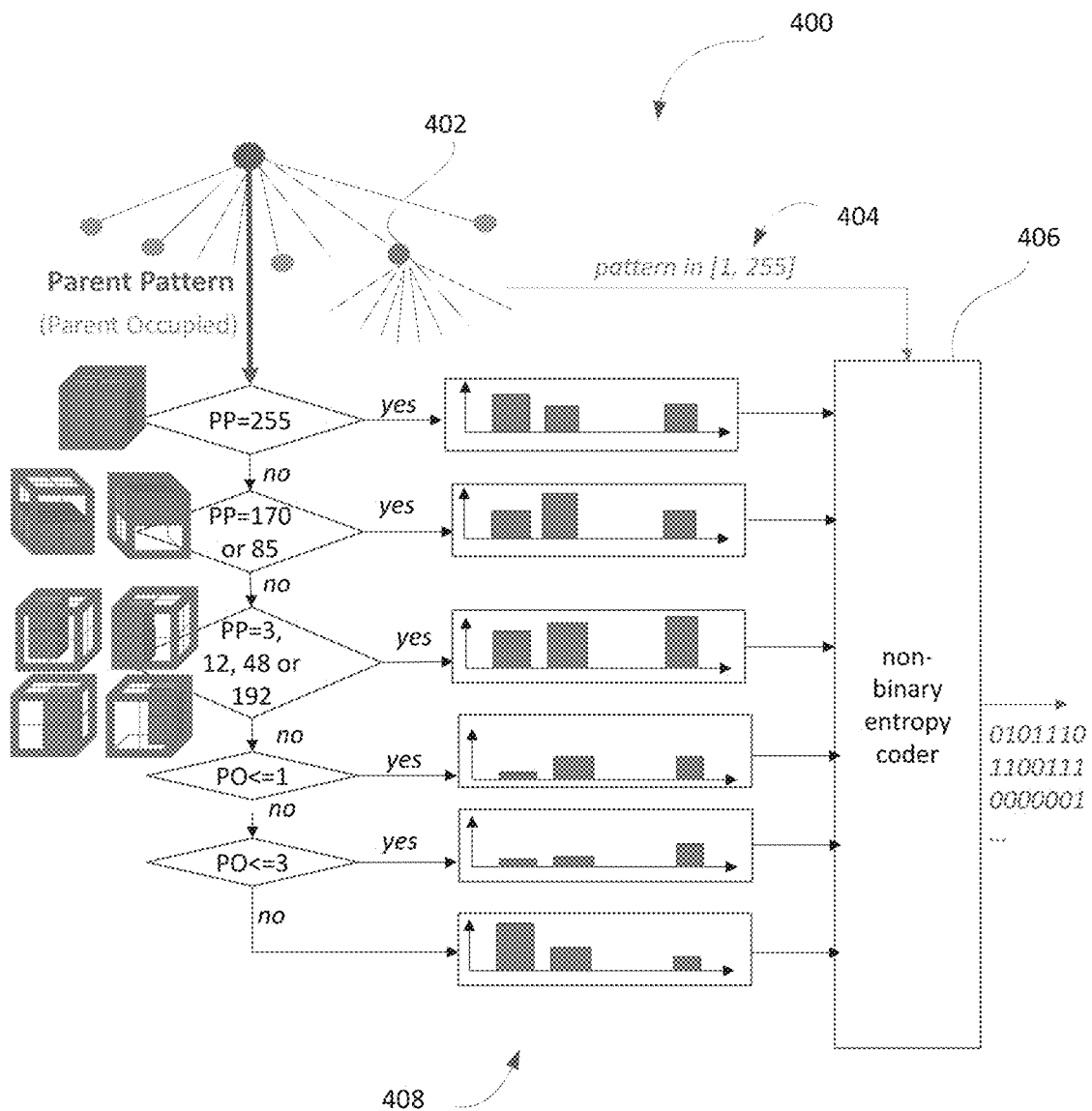
FIG. 11 diagrammatically shows one illustrative embodiment of a process of point cloud entropy encoding using parent-pattern-dependent context.

Reference is now made to FIG. 11, which diagrammatically shows one illustrative embodiment of a process 400 of point cloud entropy encoding using parent-pattern-dependent context. In this example, a current node 402 has been split into eight child nodes and its occupancy pattern 404 is to be encoded using a non-binary entropy encoder 406. The non-binary entropy encoder 406 uses a probability distribution selected from one of six possible probability distributions 408. The selection is based on the parent pattern—that is the selection is based on occupancy information from the parent node to the current node 402. The parent pattern is identified by an integer between 1 and 255.

The selection of the probability distribution may be a decision tree that assesses whether the pattern corresponds to a full node (e.g. pattern=255), a horizontal structure (e.g. pattern=170 or 85; assuming the Z axis is vertical), a vertical structure (e.g. pattern=3, 12, 48, 192), a sparsely populated distribution (e.g. pattern=1, 2, 4, 8, 16, 32, 64, or 128; i.e. none of the sibling nodes are occupied), a semi-sparsely populated distribution (total number of occupied nodes among current node and sibling nodes≤3), and all other cases. The example patterns indicated for the different categories are merely examples. For example, the "horizontal" category may include patterns involving two or three occupied cubes on the same horizontal level. The "vertical" category may include patterns involving three or four occupied cubes in a wall-like arrangement. It will also be appreciated that finer gradations may be used. For example, the "horizontal" category may be further subdivided into horizontal in the upper part of the cube and horizontal in the bottom part of the cube with different probability distributions for each. Other groupings of occupancy patterns having some correlation may be made and allocated to a corresponding probability distribution. Further discussion regarding grouping of patterns in the context of neighbour configurations, and invariance between neighbour configurations is set out further below.

Figure 12:
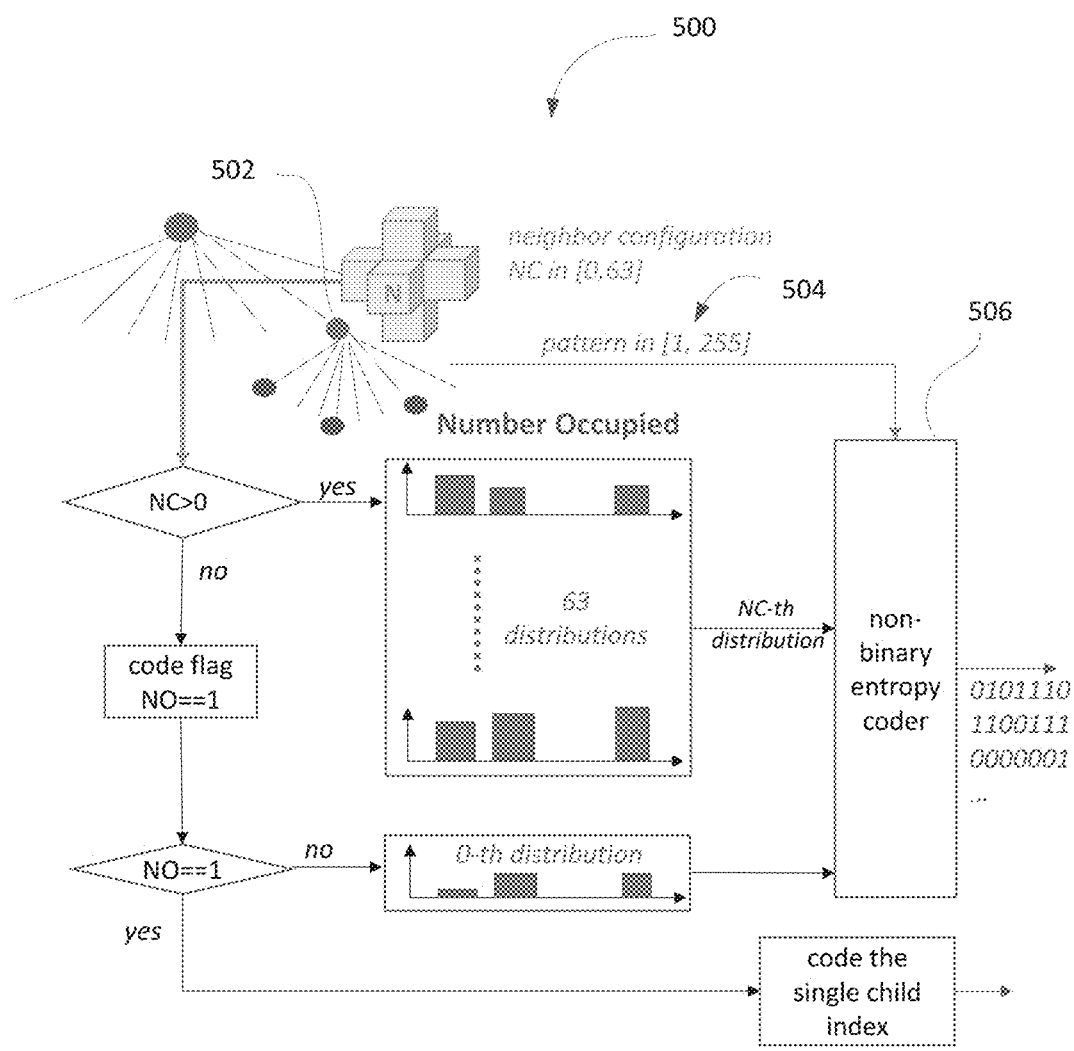
FIG. 12 shows an illustrative embodiment of a process of point cloud entropy encoding using neighbour-configuration-dependent context.

FIG. 12 shows an illustrative embodiment of a process 500 of point cloud entropy encoding using neighbour-configuration-dependent context. This example assumes the definition of neighbour and neighbour configuration numbering used above in connection with FIG. 9. This example also presumes that each neighbour configuration has a dedicated probability distribution, meaning there are 64 different probability distributions. A current node 502 has an occupancy pattern 504 to be encoded. The probability distribution is selected based on the neighbouring nodes to the current node 502. That is, the neighbour configuration NC in [0, 63] is found and used to select the associated probability distribution.

It will be appreciated that in some embodiments, neighbour configurations may be grouped such that more than one neighbour configuration uses the same probability distribution based on similarities in the patterns. In some embodiments, the process may use a different arrangement of neighbours for contextualisation (selection) of the distributions. Additional neighbours may be added such as the eight neighbours diagonally adjacent on all three axes, or the twelve diagonally adjacent on two axes. Embodiments that avoid particular neighbours may also be used, for example to avoid using neighbours that introduce additional dependencies in a depth-first scan, or only introduce dependencies on particular axes so as to reduce codec state for large trees.

In this example, the case of NC=0 is handled in a specific manner. If there are no neighbours that are occupied, it may indicate that the current node 502 is isolated. Accordingly, the process 500 further checks how many of the child nodes to the current node 502 are occupied. If only one child node is occupied, i.e. NumberOccupied (NO) is equal to 1, then a flag is encoded indicating that a single child node is occupied and the index to the node is coded using 3 bits. If more than one child node is occupied, then the process 500 uses the NC=0 probability distribution for coding the occupancy pattern.

Figure 13:
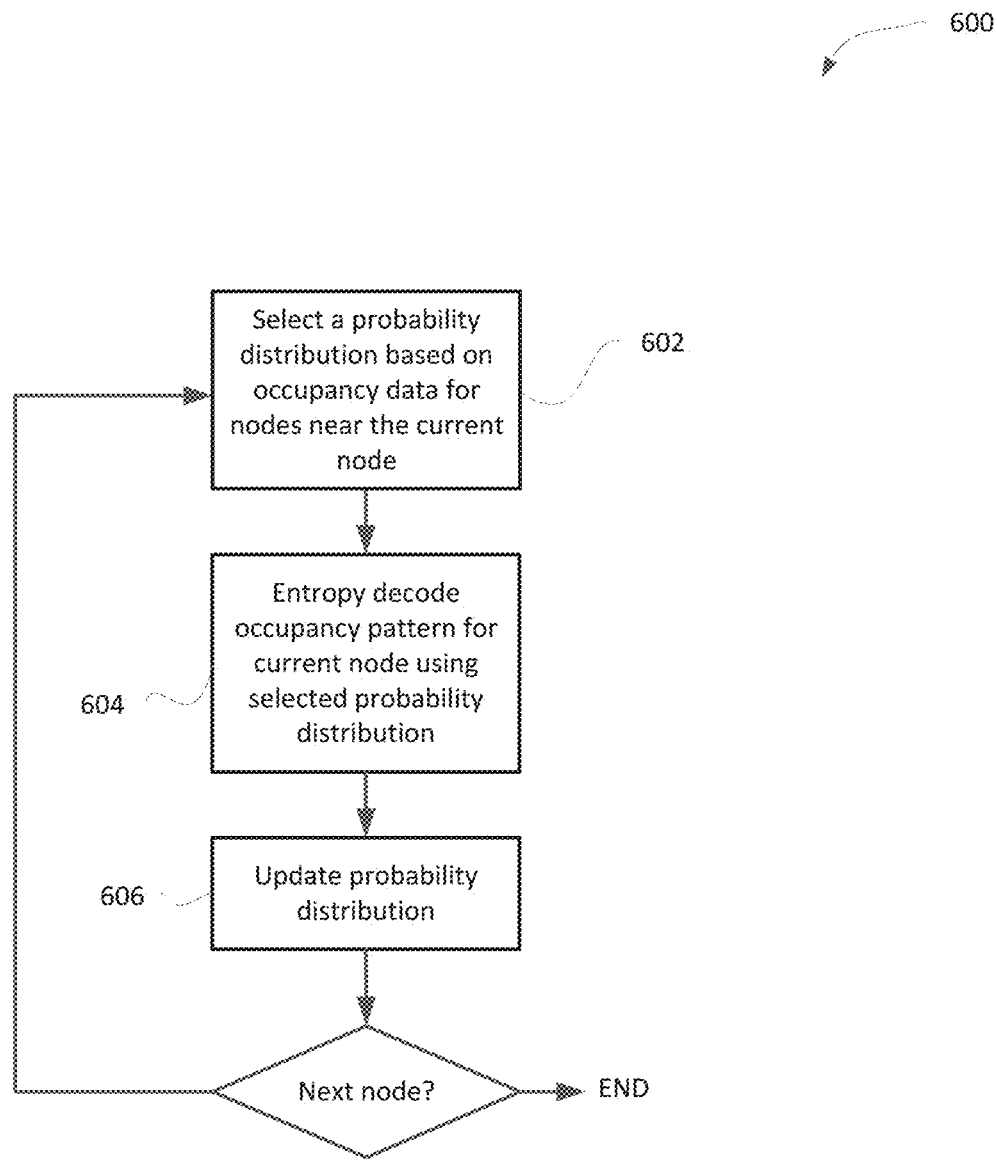
FIG. 13 shows, in flowchart form, one example method for decoding a bitstream of compressed point cloud data.

Reference is now made to FIG. 13, which shows, in flowchart form, one example method 600 for decoding a bitstream of encoded point cloud data.

In operation 602, the decoder selects one of the probability distributions based on occupancy information from one or more nodes near the current node. As described above, the occupancy information may be a parent pattern from the parent node to the current node, i.e. occupancy of the current node and its siblings, or it may be occupancy of neighbouring nodes to the current node, which may include some of the sibling nodes. Other or additional occupancy information may be used in some implementations.

Once the probability distribution has been selected then in operation 604 the decoder entropy decodes a portion of the bitstream using the selected probability distribution to reconstruct the occupancy pattern for the current node. The occupancy pattern is used by the decoder in reconstructing the tree so as to reconstruct the encoded point cloud data. Once the point cloud data is decoded, it may be output from the decoder for use, such as for rendering a view, segmentation/classification, or other applications.

In operation 606, the decoder updates the probability distribution based on the reconstructed occupancy pattern, and then if there are further nodes to decode, then it moves to the next node in the buffer and returns to operation 602.

Example implementations of the above-described methods have proven to provide a compression improvement with a negligible increase in coding complexity. The neighbour-based selection shows a better compression performance than the parent-pattern based selection, although it has a greater computational complexity and memory usage. In some testing the relative improvement in bits-per-point over the MPEG Point Cloud Test Model is between 4 and 20%. It has been noted that initializing the probability distributions based on a distribution arrived at with test data leads to improved performance as compared to initializing with a uniform distribution.

Some of the above examples are based on a tree coding process that uses a non-binary coder for signalling occupancy pattern. New developments to employ binary entropy coders are presented further below.

In one variation to the neighbour-based probability distribution selection, the number of distributions may be reduced by exploiting the symmetry of the neighbourhood. By permuting the neighbourhood or permuting the pattern distribution, structurally similar configurations having a line of symmetry can re-use the same distribution. In other words, neighbour configurations that can use the same pattern distribution may be grouped into a class. A class containing more than one neighbour configuration may be referred to herein as a "neighbour configuration" in that one of the neighbour configurations effectively subsumes other neighbour configurations by way of reflection or permutation of those other configurations.

Consider, as an example, the eight corner patterns $NC \in$ [21, 22, 25, 26, 37, 38, 41, 42], each representing a symmetry of a corner neighbour pattern. It is likely that these values of NC are well correlated with particular but different patterns of a node. It is further likely that these correlated patterns follow the same symmetries as the neighbour pattern. By way of example, a method may be implemented that re-uses a single distribution to represent multiple cases of NC by way of permuting the probabilities of that distribution.

An encoder derives the pattern number of a node based on the occupancy of the child nodes. The encoder selects a distribution and a permutation function according to the neighbour configuration. The encoder reorders the probabilities contained within the distribution according to the permutation function, and subsequently uses the permuted distribution to arithmetically encode the pattern number. Updates to the probabilities of the permuted distribution by the arithmetic encoder are mapped back to the original distribution by way of an inverse permutation function.

A corresponding decoder first selects the same distribution and permutation function according to the neighbour configuration. A permuted distribution is produced in an identical manner to the encoder, with the permuted distribution being used by the arithmetic decoder to entropy decode the pattern number. The bits comprising the pattern number are then each assigned to the corresponding child.

It should be noted that the same permutation may be achieved without reordering the data of the distribution itself, but rather introducing a level of indirection and using the permutation function to permute the lookup of a given index in the distribution.

An alternative embodiment considers permutations of the pattern itself rather than the distribution, allowing for a shuffling prior to or after entropy encoding/decoding respectively. Such a method is likely to be more amenable to efficient implementation through bit-wise shuffle operations. In this case, no reordering of the distribution is performed by either the encoder or decoder, rather the computation of the encoded pattern number is modified to be $pn=\Sigma_{i=0}^{7} 2^i c_{\sigma(i)}$, where $c_i$ is the i-th child's occupancy state, and $\sigma(i)$ is a permutation function. One such example permutation function $$\sigma = \begin{pmatrix} 0 & 1 & 2 & 3 & 4 & 5 & 6 & 7 \\ 4 & 7 & 6 & 5 & 0 & 3 & 2 & 1 \end{pmatrix}$$

allows the distribution for NC=22 to be used for that of NC=41. The permutation function may be used by a decoder to derive a child node's occupancy state from the encoded pattern number using $c_i = \lfloor pn/2^{\sigma(i)} \rfloor \mod 2$.

Methods to derive the required permutation may be based on rotational symmetries of the neighbour configurations, or may be based on reflections along particular axes. Furthermore, it is not necessary for the permutation to permute all positions according to, for instance, the symmetry; a partial permutation may be used instead. For example, when permuting NC=22 to NC=41, the positions in the axis of symmetry may not be permuted, leading to the mapping $$\sigma = \begin{pmatrix} 0 & 1 & 2 & 3 & 4 & 5 & 6 & 7 \\ 0 & 7 & 2 & 5 & 4 & 3 & 6 & 1 \end{pmatrix},$$

where positions 0, 2, 4, 6 are not permuted. In other embodiments, only the pair 1 and 7 are swapped.

Figure 16:
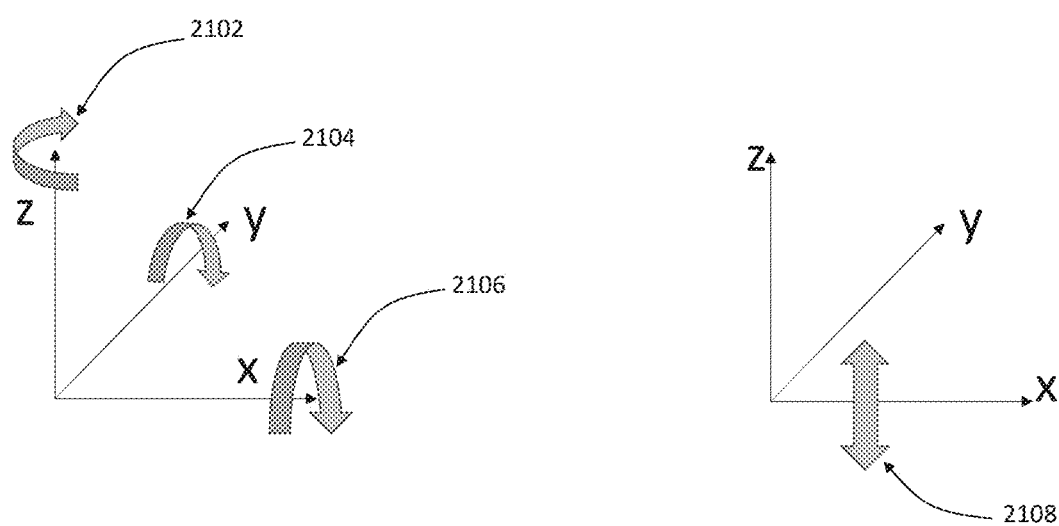
FIG. 16 shows an example Cartesian coordinate system and example rotations and/or reflections about the axes.

Examples of embodiments based on rotational symmetries and reflections are provided hereafter for the specific case of an octree with six neighbours sharing a common face with the current cube. Without loss of generality, as shown in FIG. 16, the Z axis extends vertically relative to the direction of viewing the figure. Relative positions of neighbours such as "above" (resp. "below") should then be understood as along the Z axis in increasing (resp. decreasing) Z direction. The same remark applies for left/right along the X axis, and front/back along the Y axis.

FIG. 16 shows three rotations 2102, 2104 and 2106 along the Z, Y and X axes, respectively. The angle of these three rotations is 90 degrees, i.e. they perform a rotation along their respective axis by a quarter of a turn.

Figure 17:
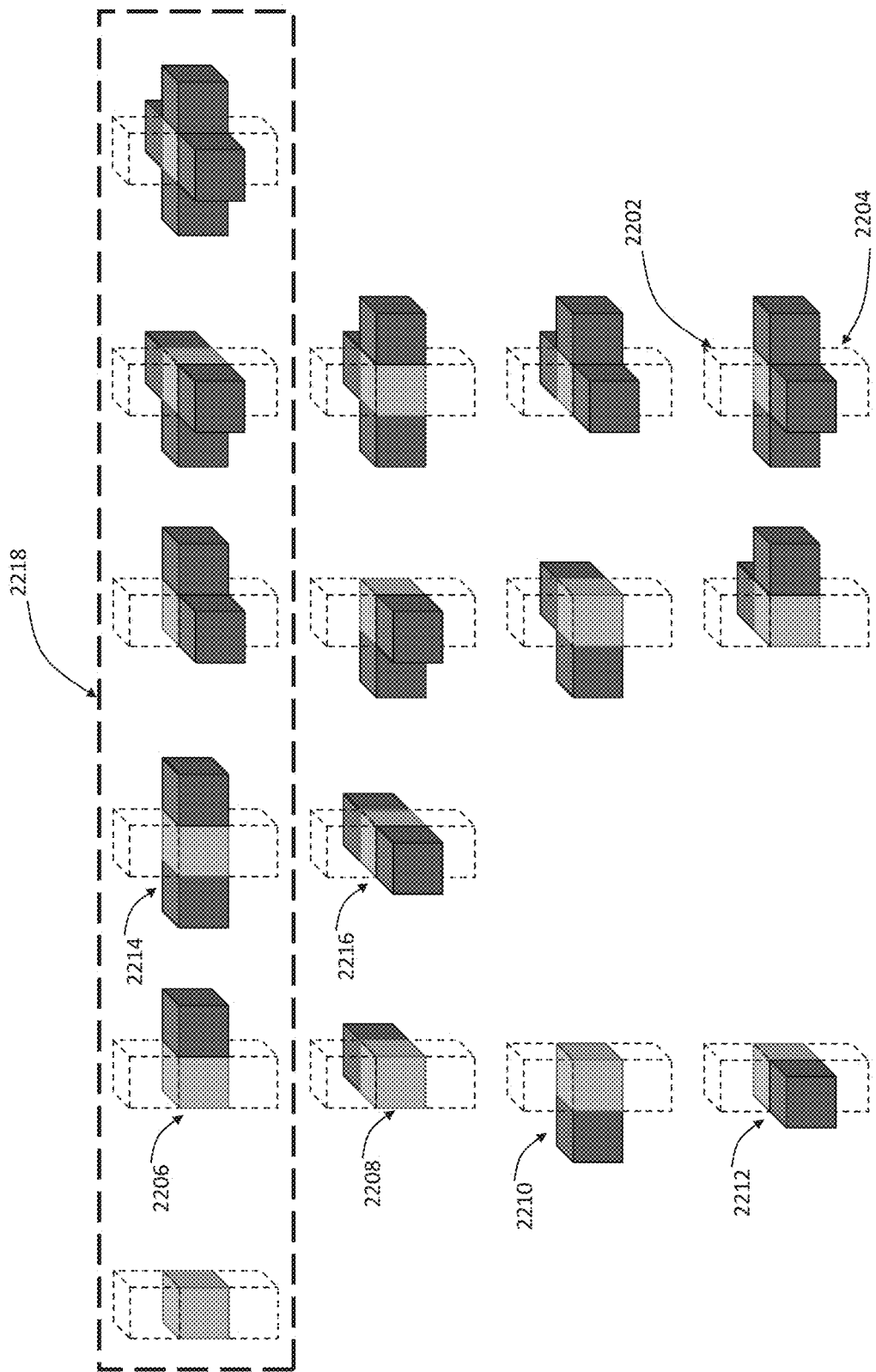
FIG. 17 shows classes of invariance of neighbour configuration under one or several iterations of the rotation about the Z axis.

FIG. 17 shows classes of invariance of neighbour configuration under one or several iterations of the rotation 2102 along the Z axis. This invariance is representative of the same statistical behaviour of the point cloud geometry along any direction belonging to the XY plane. This is particularly true for the use-case of a car moving on the Earth surface that is locally approximated by the XY plane. A horizontal configuration is the given occupancy of the four neighbours (located at the left, right, front and back of the current cube) independently of the occupancy of the above neighbour (2202) and the below neighbour (2204). The four horizontal configurations 2206, 2208, 2210 and 2212 belong to the same class of invariance under the rotation 2102. Similarly, the two configurations 2214 and 2216 belong to the same class of invariance. There are only six classes (grouped under the set of classes 2218) of invariance under the rotation 2102.

Figure 18:
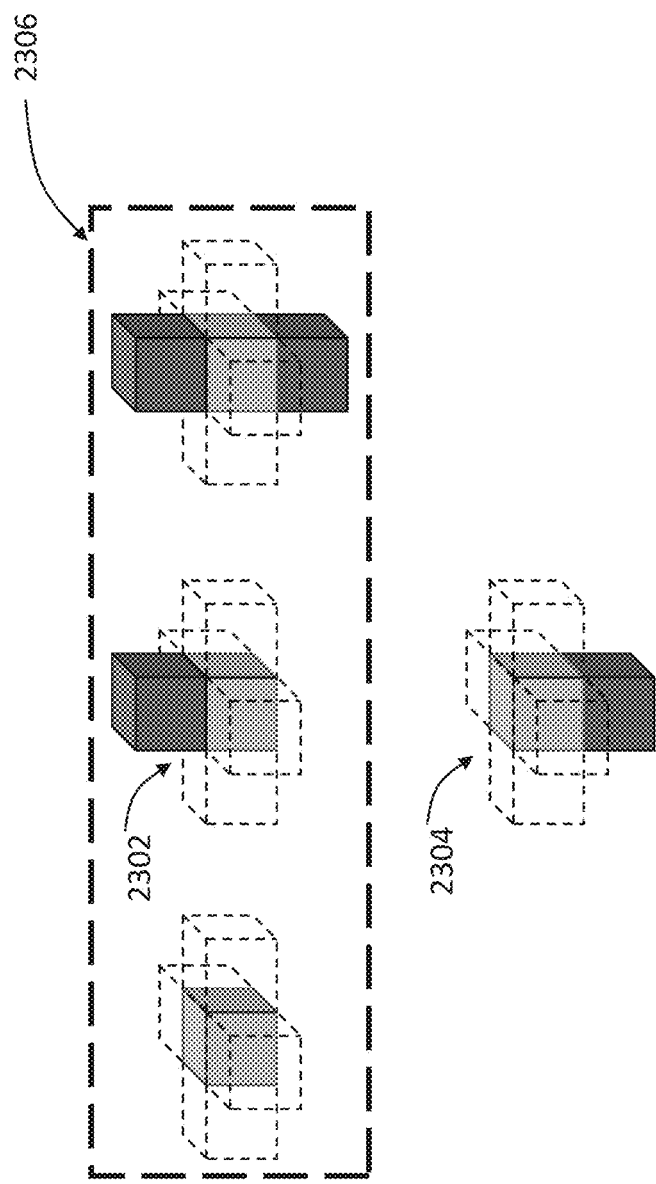
FIG. 18 shows classes of invariance of neighbour configuration for vertical reflection.

A vertical configuration is the given occupancy of the two neighbours 2202 and 2204 independently of the occupancy of the four neighbours located at the left, right, front and back of the current cube. There are four possible vertical configurations as shown on FIG. 18. Consequently, if one considers invariance relatively to the rotation 2102 along the Z axis, there are 6×4=24 possible configurations.

The reflection 2108 along the Z axis is shown on FIG. 16. The vertical configurations 2302 and 2304 depicted on FIG. 18 belong to the same class of invariance under the reflection 2108. There are three classes (grouped under the set of classes 2306) of invariance under the reflection 2108. The invariance under reflection 2108 means that upward and downward directions behave essentially the same in term of point cloud geometry statistics. It is an accurate assumption for a moving car on a road.

Figure 19:
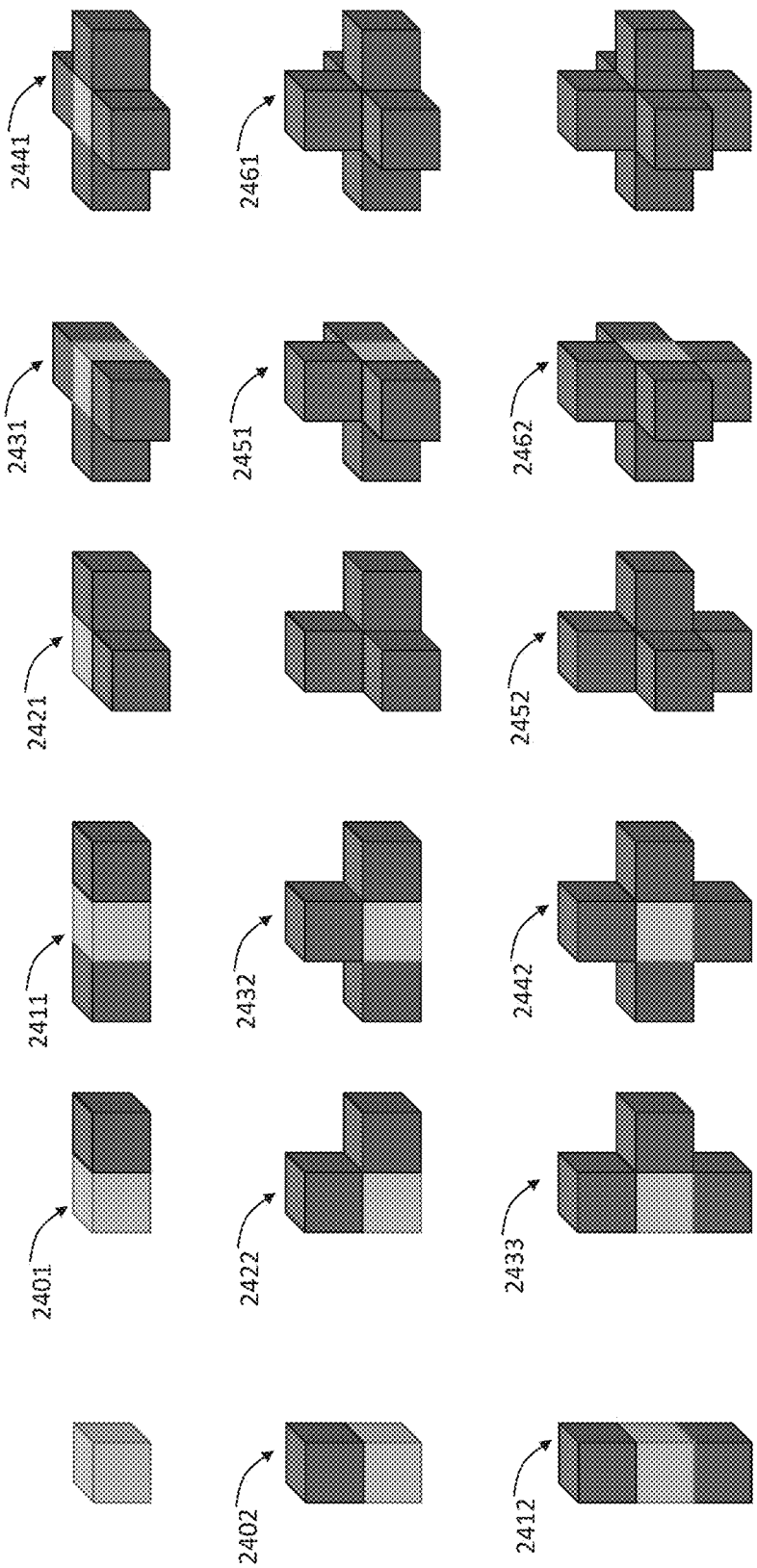
FIG. 19 shows classes of invariance for both rotation and reflection.

If one assumes invariance under both the rotation 2102 and the reflection 2108 there are 18 classes of invariances, resulting from the product of the two sets 2218 and 2306. These 18 classes are represented in FIG. 19.

Figure 20:
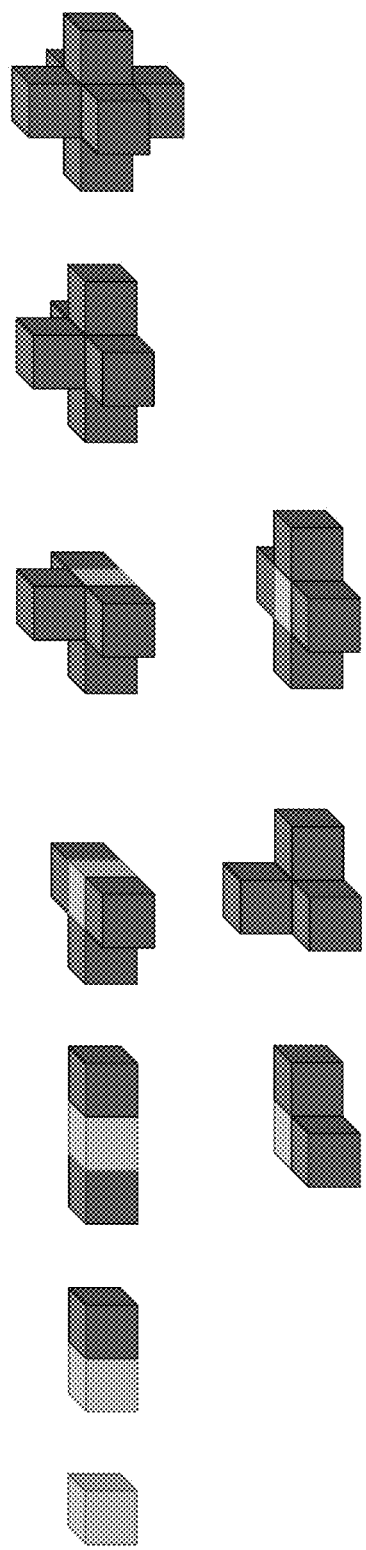
FIG. 20 shows classes of invariance for under three rotations and the reflection.

Applying further invariance under the two other rotations 2104 and 2106, the two configurations 2401 and 2402 belong to the same class of invariance. Furthermore, the two configurations 2411 and 2412, the two configurations 2421 and 2422, the three configurations 2431, 2432 and 2433, the two configurations 2441 and 2442, the two configurations 2451 and 2452, and finally the two configurations 2461 and 2462 belong to same classes. Consequently, invariance under the three rotations (2102, 2104 and 2106) and the reflection 2108 leads to 10 classes of invariance as shown on FIG. 20.

From the examples provided hereinabove, assuming or not invariance under three rotations and the reflection, the number of effective neighbour configurations, i.e. classes into which the 64 neighbour configuration may be grouped, is either 64, 24, 18 or 10.

Prior to entropy coding, the pattern undergoes the same transformation, i.e. rotations and reflection, as the neighbour configuration does to belong to one of the invariance classes. This preserves the statistical consistency between the invariant neighbour configuration and the coded pattern.

It will also be understood that during the traversal of a tree, a child node will have certain neighbouring nodes at the same tree depth that have been previously visited and may be causally used as dependencies. For these same-level neighbours, instead of consulting the parent's collocated neighbour, the same-level neighbours may be used. Since the same-level neighbours have halved dimensions of the parent, one configuration considers the neighbour occupied if any of the four directly adjacent neighbouring child nodes (i.e., the four sharing a face with the current node) are occupied.

Entropy Coding Tree Occupancy Patterns Using Binary Coding

The above-described techniques of using neighbour occupancy information for coding tree occupancy were detailed in European patent application no. 18305037.6. The described embodiments focus on using non-binary entropy coding of the occupancy pattern, where a pattern distribution is selected based on neighbour occupancy information. However, in some instances, the use of binary coders can be more efficient in terms of hardware implementation. Moreover, on-the-fly updates to many probabilities may require fast-access memory and computation within the heart of the arithmetic coder. Accordingly, it may be advantageous to find methods and devices for entropy encoding the occupancy pattern using binary arithmetic coders. It would be advantageous to use binary coders if it can be done without significantly degrading compression performance and while guarding against having an overwhelming number of contexts to track.

The use of binary coders in place of a non-binary coder is reflected in the entropy formula:

$$H(X_1, X_2 | Y) = H(X_1 | Y) H(X_2 | Y, X_1)$$

where $X = (X_1, X_2)$ is the non-binary information to be coded, and Y is the context for coding, i.e. the neighbour configuration or selected pattern distribution. To convert non-binary coding of X into binary coding, the information $(X_1, X_2)$ is split into information $X_1$ and $X_2$ that can be coded separately without increasing the entropy. To do so, one must code one of the two depending on the other, here $X_2$ depending on $X_1$. This can be extended to n bits of information in X. For example, for n=3:

$$H(X_1, X_2, X_3 | Y) = H(X_1 | Y) H(X_2 | Y, X_1) H(X_3 | Y, X_1, X_2)$$

It will be understood that as the occupancy pattern, i.e. bit sequence X, gets longer there are more conditions for coding later bits in the sequence. For a binary coder (e.g. CABAC) this means a large increase in the number of contexts to track and manage. Using an octree as an example, where the occupancy pattern is an eight-bit sequence $b=b_0 \ldots b_7$, the bit sequence may be split into the eight binary information bits $b_0 \ldots b_7$. The coding may use the neighbour configuration N (or NC) for determining context. Assuming that we can reduce the neighbour configurations to 10 effective neighbour configurations through grouping of neighbour configurations into classes of invariance, as described above, then N is an integer belonging to $\{0,1,2, \ldots, 9\}$. For shorthand, the "classes of invariant neighbour configurations" may be referred to herein, at times, simply as the "neighbour configurations", although it will be appreciated that this reduced number of neighbour configurations may be realized based on the class-based grouping of neighbour configurations based on invariance.

FIG. 21 illustrates the splitting of an eight-bit pattern or sequence into eight individual bits for binary entropy coding. It will be noted that the first bit of the sequence is encoded based on the neighbour configuration, so there are ten total contexts available. The next bit of the sequence is encoded based on the neighbour configuration and any previously-encoded bits, i.e. bit $b_0$. This involves 20 total available contexts: obtained as the product of 10 from N and 2 from $b_0$. The final bit, $b_7$, is entropy encoded using a context selected from 1280 available contexts: obtained as the product of 10 from N and 128 from the partial pattern given by the previously-encoded bits $b_0, \ldots, b_6$. That is, for each bit the number of contexts (i.e. possible combinations of conditions/dependencies) is the product of the number of neighbour configurations defined (10, in this example, based on grouping of the 64 neighbour configurations into classes), and the number of partial patterns possible from the ordered sequence of n-1 previously-encoded bits (given by $2^{n-1}$).

As a result, there are a total of 2550 contexts to maintain in connection with binary coding of the occupancy pattern. This is an excessively large number of contexts to track, and the relative scarcity may cause poor performance because of context dilution, particularly for later bits in the sequence.

Accordingly, in one aspect, the present application discloses encoders and decoders that determine whether the set of contexts can be reduced and, if so, apply a context reduction operation to realize a smaller set of available contexts for entropy coding at least part of an occupancy pattern using a binary coder. In another aspect, the present application further discloses encoders and decoders that apply one or more rounds of state reduction using the same context reduction operations in order to perform effective context selection from a fixed number of contexts. In some implementations, the context reduction is applied a priori in generating look-up tables of contexts and/or algorithmic conditionals that are then used by the encoder or decoder in selecting a suitable context. The reduction is based on a testable condition that the encoder and decoder evaluate to determine which look-up table to select from or how to index/select from that look-up table to obtain a selected context.

Figure 22:
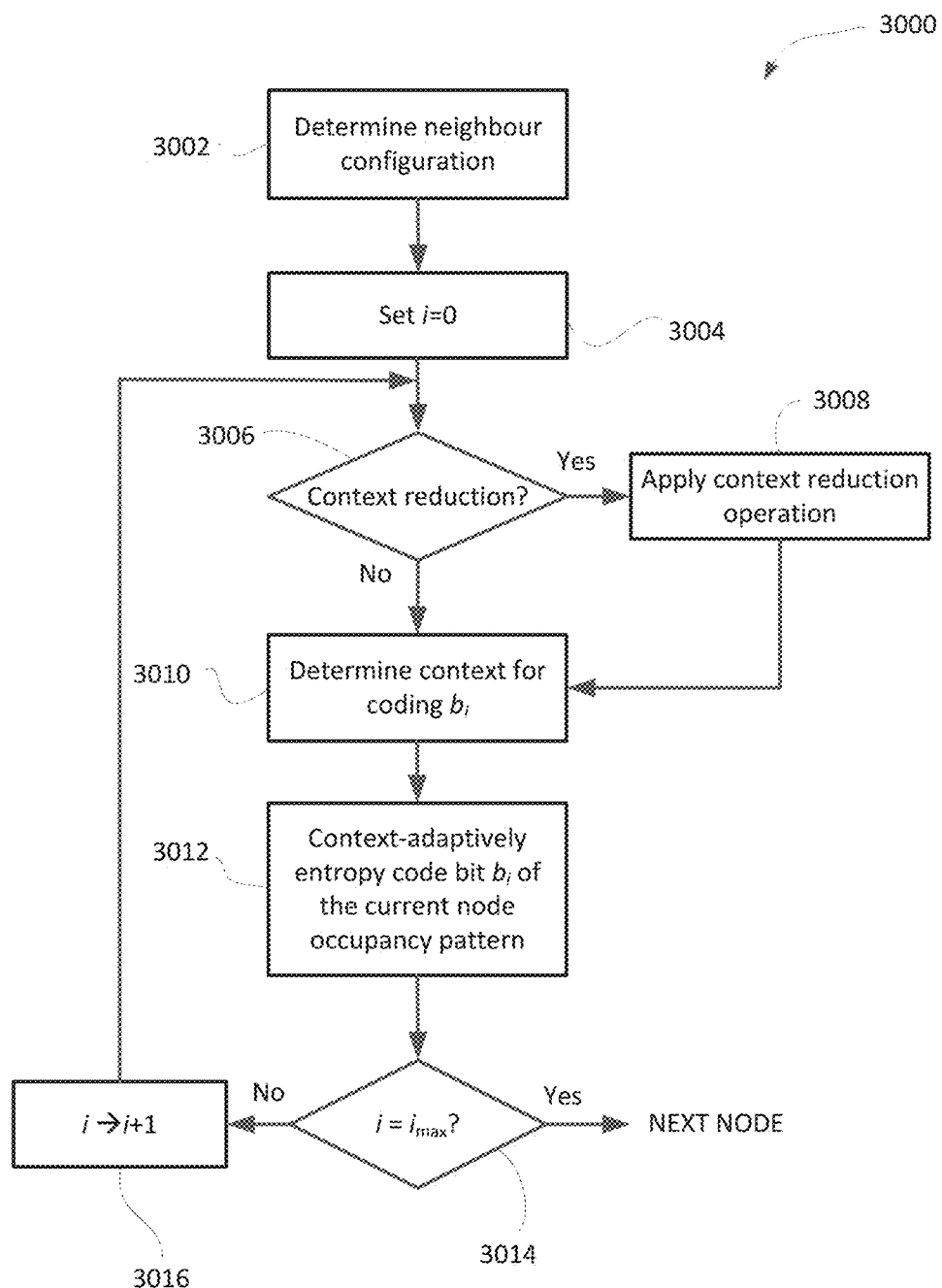
FIG. 22 shows in flowchart form, one example method for coding occupancy patterns in a tree-based point cloud coder using binary coding.

Reference is now made to FIG. 22, which shows, in flowchart form, one example method 3000 for coding occupancy patterns in a tree-based point cloud coder using binary coding. The method 3000 may be implemented by an encoder or a decoder. In the case of an encoder, the coding operations are encoding, and in the case of a decoder the coding operations are decoding. The encoding and decoding is context-based entropy encoding and decoding.

The example method 3000 is for entropy coding an occupancy pattern, i.e. a bit sequence, for a particular node/volume. The occupancy pattern signals the occupancy status of the child nodes (sub-volumes) of the node/volume. In the case of an octree, there are eight child nodes/sub-volumes. In operation 3002, the neighbour configuration is determined. The neighbour configuration is the occupancy status of one or more volumes neighbouring the volume for which an occupancy pattern is to be coded. As discussed above, there are various possible implementations for determining neighbour configuration. In some examples, there are 10 neighbour configurations, and the neighbour configurations for a current volume is identified based on the occupancy of the six volumes that share a face with the current volume.

In operation 3004, an index i to the child nodes of the current volume is set to 0. Then in operation 3006 an assessment is made as to whether context reduction is possible. Different possible context reduction operations are discussed in more detail below. The assessment of whether context reduction is possible may be based, for example, on which bit in the bit sequence is being coded (e.g. the index value). In some cases, context reduction may be possible for later bits in the sequence but not for the first few bits. The assessment of whether context reduction is possible may be based, for example, on the neighbour configuration as certain neighbour configurations may allow for simplifications. Additional factors may be used in assessing whether context reduction is possible in some implementations. For example, an upper bound Bo may be provided as the maximum number of contexts a binary coder can use to code a bit, and if the initial number of contexts to code a bit is higher than Bo then context reduction is applied (otherwise it is not) such that the number of contexts after reduction is at most Bo. Such a bound Bo may be defined in an encoder and/or decoder specification in order to ensure that a software or hardware implementation capable to deal with Bo contexts will always be able to encode and/or decode a point cloud without generating an overflow in term of the number of contexts. Knowing the bound Bo beforehand also allows for anticipating the complexity and the memory footprint induced by the binary entropy coder, thus facilitating the design of hardware. Typical values for Bo are from ten to a few hundred.

If context reduction is determined to be available, then in operation 3008 a context reduction operation is applied. The context reduction operation reduces the number of available contexts in a set of available contexts to a smaller set containing fewer total contexts. It will be recalled, that the number of available contexts may depend, in part, on the bit position in the sequence, i.e. the index, since the context may depend on a partial pattern of previously-coded bits from the bits sequence. In some implementations, the number of contexts available in the set, before reduction, may be based on the number of neighbour configurations multiplied by the number of partial patterns possible with the previously-coded bits. For a bit at index i, where i ranges from 0 to n, the number of partial patterns may be given by $2^i$.

As noted above, in some implementations the context reduction operations are carried out prior to the coding, and the resulting reduced context sets are the context sets available for use by the encoder and decoder during the coding operation. Use and/or selection of the reduced context set during coding may be based on evaluation of one or more conditions precedent to use of those reduced sets that correspond to the conditions evaluated in operation 3006 for determining that the number of contexts can be reduced. For example, in the case of a specific neighbour configuration that permits use of reduced context set, the encoder and/or decoder may first determine whether that neighbour configuration condition is met and then, if so, use the corresponding reduced context set.

In operation 3010, the context for bit $b_i$ is determined, i.e. selected from the set (or reduced set, if any) of available contexts based on the neighbour configuration and the partial pattern of previously-coded bits in the bit sequence. The current bit is then entropy encoded by a binary coder using the selected context in operation 3012.

If, in operation 3014, the index i indicates that the currently coded bit is the last bit in the sequence, i.e. that i equals $i_{max}$, then the coding process advances to the next node. Otherwise, the index i is incremented in operation 3016 and the process returns to operation 3006.

It will be appreciated that in some implementations, context selection may not depend on neighbour configuration. In some cases, it may only depend on the partial pattern of previously-coded bits in the sequence, if any.

Figure 23:
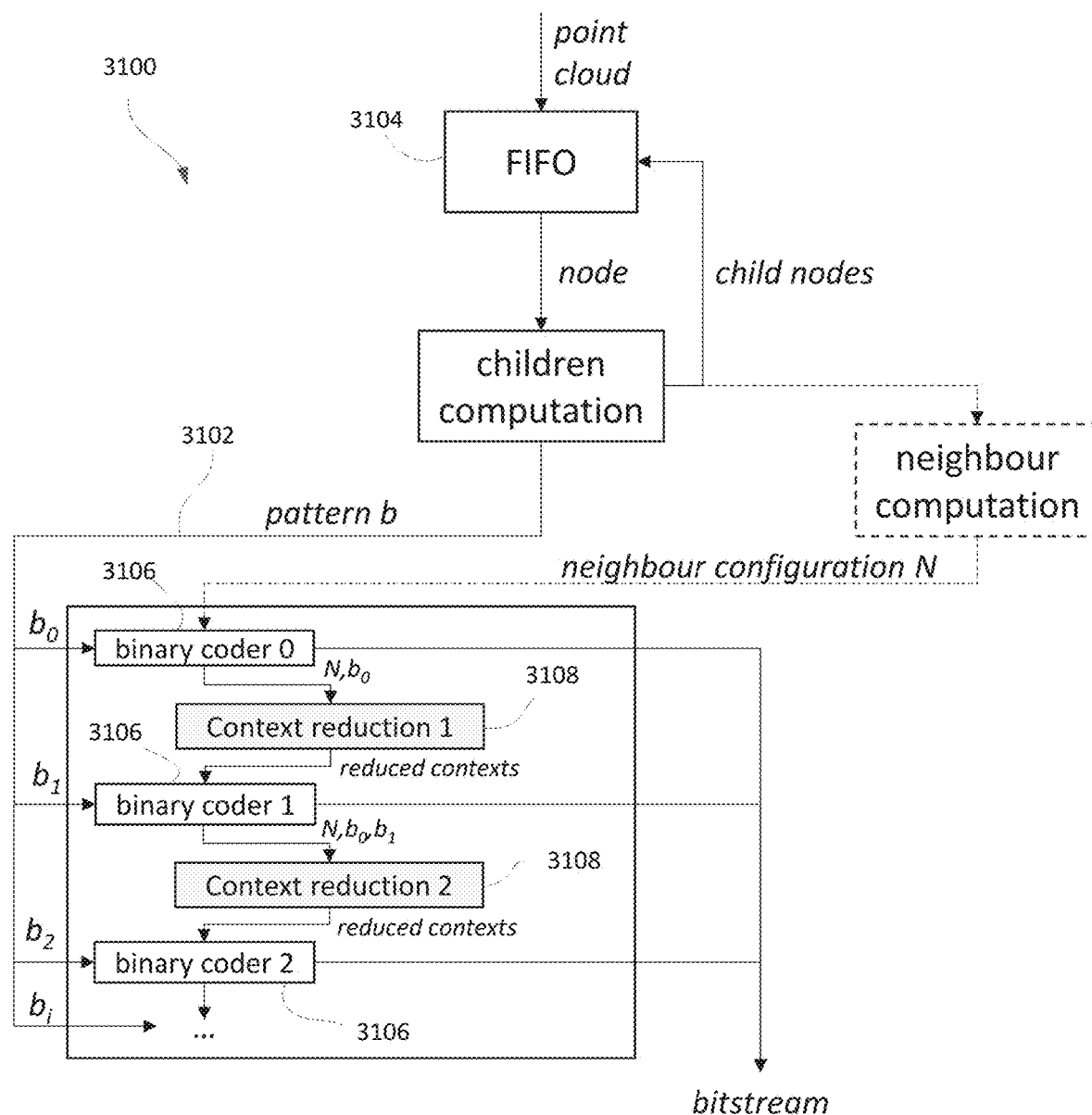
FIG. 23 shows a simplified block diagram of part of an example encoder.

A simplified block diagram of part of an example encoder 3100 is illustrated in FIG. 23. In this illustration it will be understood that the occupancy pattern 3102 is obtained as the corresponding volume is partitioned into child nodes and cycled through a FIFO buffer 3104 that holds the geometry of the point cloud. Coding of the occupancy pattern 3102 is illustrated as involving a cascade of binary coders 3106, one for each bit of the pattern. Between at least some of the binary coders 3106 is a context reduction operation 3108 that operates to reduce the available contexts to a smaller set of available contexts.

Although FIG. 23 illustrates a series of binary coders 3106, in some implementations only one binary coder is used. In the case where more than one coder is used, the coding may be (partly) parallelized. Given the context dependence of one bit on preceding bits in the bit sequence, the coding of the pattern cannot necessarily be fully parallelized, but it may be possible to improve pipelining through using cascading binary coders for a pattern to achieve some degree of parallelization and speed improvement.

Context Determination Based on Sub-Volume Neighbour Configuration

In the above, the context (i.e., probability associated with a respective entropy coder that will be used for entropy coding) for a current occupancy bit $b_i$ in the bit sequence is determined, i.e., selected from the set (or reduced set, if any) of available contexts based on the neighbour configuration and the partial pattern of previously-coded bits in the bit sequence. The current bit is then entropy encoded by a binary coder using the selected context (probability). Additionally or alternatively, the occupancy status of child nodes of neighbouring nodes of the current node (e.g., of already coded occupied neighbouring nodes) can be taken into account for determining the context (e.g., probability) for coding a bit $b_i$ in the bit sequence of the current node. Implementations that take into account the occupancy status of child nodes of neighbouring nodes of the current node for determining context will be described next.

In some implementations, methods of encoding or decoding the bit sequence may use the knowledge of the occupancy status of child nodes of neighbouring nodes of the current node for determining context. That is, knowledge of the occupancy of sub-nodes of an already-coded occupied neighbouring node (possibly all neighbouring nodes or all already coded neighbouring nodes) may be used to drive (possibly together with the neighbour configuration N, e.g., reduced to ten configurations $N_{10}$) the entropy coder that codes the occupancy bits $b_i$ of the current node.

In the following, methods of encoding or decoding the bit sequence that use the knowledge of the occupancy status of child nodes of neighbouring nodes of the current node for determining context will be described, without intended limitation, with reference to an octree and cubes as volumes associated with nodes of the octree.

Figure 27:
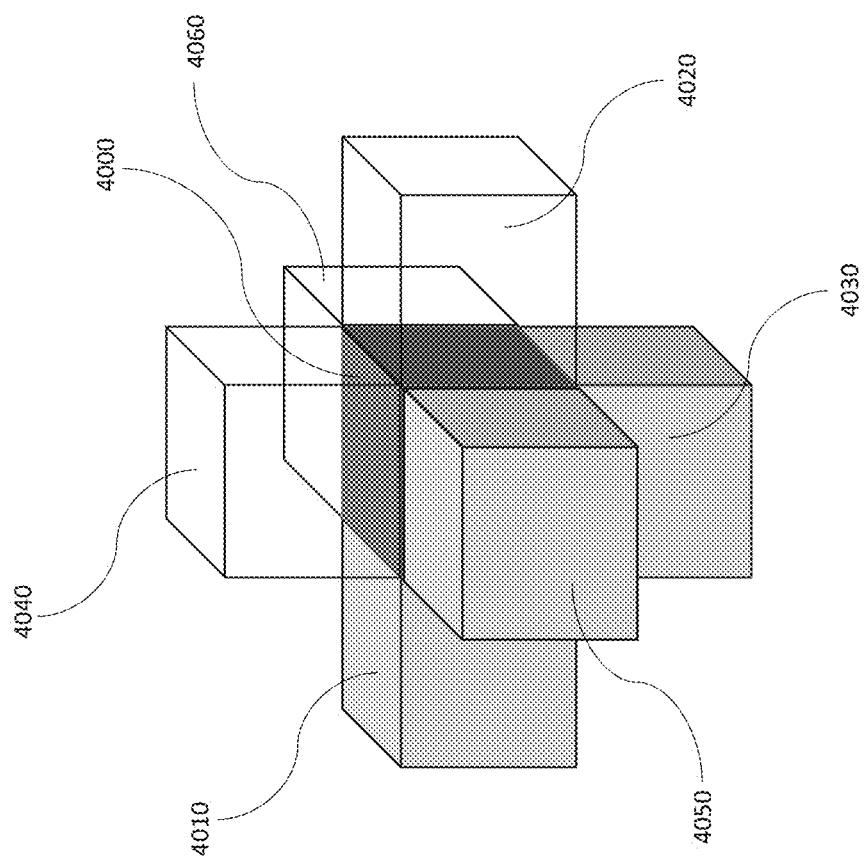
FIG. 27 shows an example of neighbouring sub-volumes among which some are already coded.

Reference is now made to FIG. 27, which shows a current node (i.e. its associated volume, or current volume) 4000 and its six neighbours 4010, 4020, 4030, 4040, 4050 and 4060. For the present example of an octree, neighbours of the current node may be defined as those nodes (at the same level or depth of the tree) whose associated volumes share a face with the current volume. Volumes that share a face with each other may also be referred to as volumes touching each other. Other definitions of neighbouring nodes are feasible as well. For example, neighbours of the current node may be those nodes (at the same level or depth of the tree) whose associated volumes share an edge (or a vertex) with the current volume. In general, regardless of tree structure, neighbouring nodes may be those nodes (at the same level or depth of the tree) whose associated volumes intersect with the current volume (e.g., at least in some predefined non-empty set).

In the context of the present application, it is understood that volumes (nodes) that intersect each other are adjacent volumes (nodes). Accordingly, the terms "having an intersection with" and "being adjacent to" may be considered as synonymous in the context of the application.

Notably, the expressions "volume" and "sub-volume" may be used somewhat interchangeably, in the sense that each sub-volume is itself a volume that can be sub-divided into sub-volumes. In any case, the volume/sub-volume relationship is understood to be clear by specification of a parent-child relationship between the nodes/volumes involved.

It is assumed that the scanning order of nodes is performed breadth first, in increasing X order, then increasing Y order and finally in increasing Z order. By doing so, the three neighbours with lowest X coordinate (i.e., neighbour 4010), lowest Y coordinate (i.e., neighbour 4030) and lowest Z coordinate (i.e., neighbour 4050) are already coded. Therefore, if one of these three neighbours is occupied, the configuration of the occupied sub-volumes associated with the occupied neighbour is known. While the present example defines a scan order in increasing X order, then increasing Y order and finally increasing Z order, also other breadth first scan orders can be used for the present purpose. Regardless of the particular breadth first scan order that is used, three neighbours will already be coded for current nodes that are not located at the boundary of the 3D space.

Figure 28:
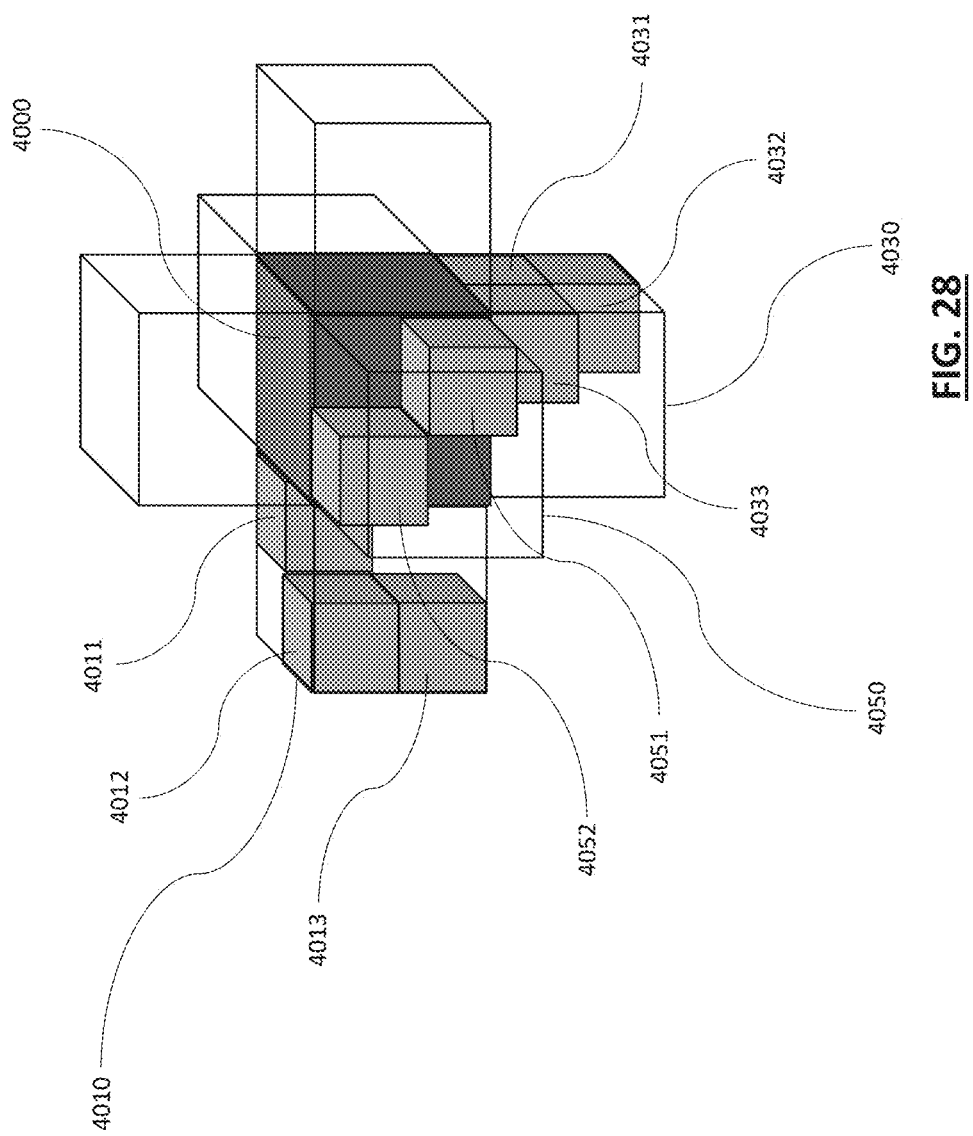
FIG. 28 shows an example of neighbouring sub-volumes and already coded sub-volumes of the neighbouring sub-volumes.

Reference is now made to FIG. 28, which shows an exemplary current volume with all three already coded neighbours (i.e., neighbours 4010, 4030 and 4050) being occupied. The occupied sub-volumes of the neighbour 4010 are sub-volumes 4011, 4012 and 4013; the occupied sub-volumes of the neighbour 4030 are sub-volumes 4031, 4032 and 4033; and the occupied sub-volumes of the neighbour 4050 are sub-volumes 4051 and 4052. In this example, all the three already coded neighbours are occupied, but it is understood that in general only two or one of them may actually be occupied, or even none of them.

The knowledge of the occupied sub-volumes of already coded occupied neighbours can be used to define a set of sub-volume neighbour configurations, e.g., one for each sub-volume of the current volume. The sub-volume neighbour configurations can be used as a criterion for selecting contexts (e.g., probabilities associated with respective binary entropy coders) for entropy coding the bits $b_i$ of the bit sequence of the current volume. Determining the sub-volume neighbour configuration for a given sub-volume of the current volume may be based on occupancy data for sub-volumes of those neighbouring volumes of the current volume that have already been coded. Further, the sub-volume neighbour configuration of a given sub-volume in the current volume may correspond to a pattern of occupancy of all those sub-volumes in neighbouring (already coded) volumes of the given volume that neighbour the given sub-volume.

Figure 29:
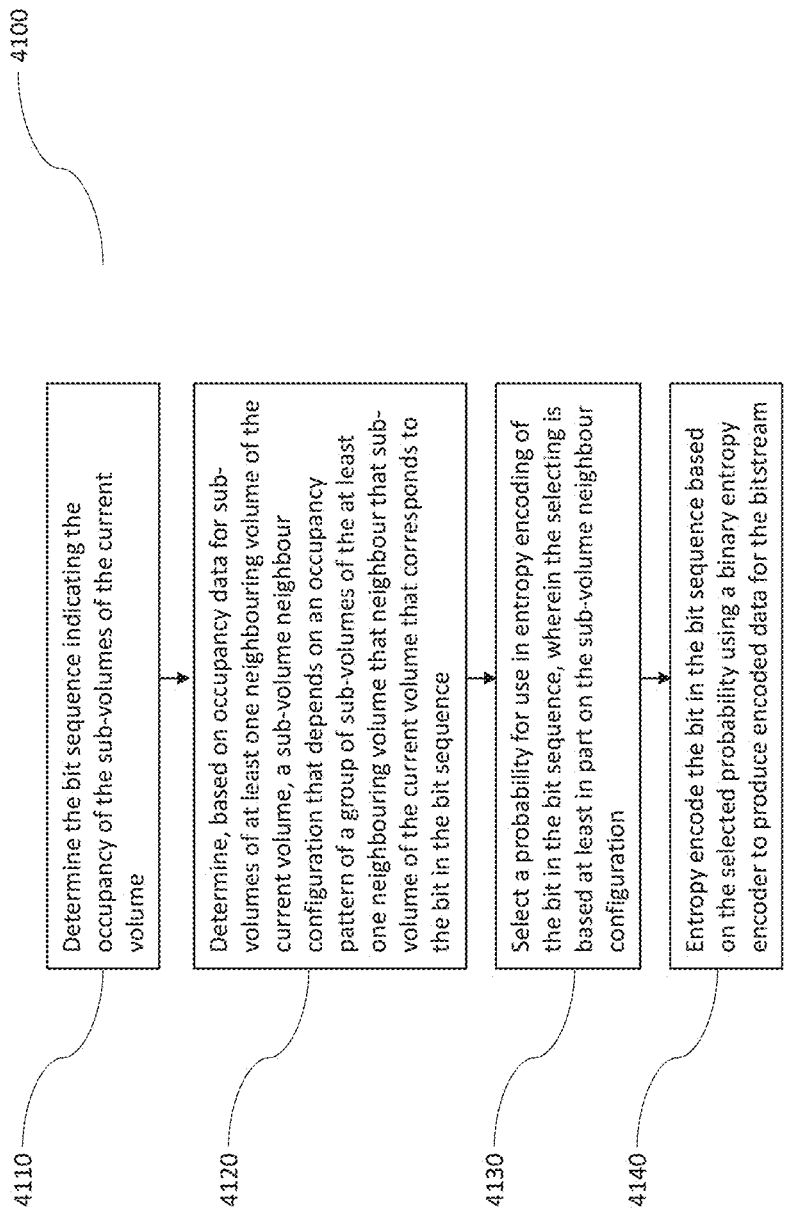
FIG. 29 shows, in flowchart form, a method of encoding an occupancy pattern of a current node based at least in part on a sub-volume neighbor configuration.

Reference is now made to FIG. 29, which shows, in flowchart form, an example of a method 4100 of encoding a point cloud to generate a bitstream of compressed point cloud data. The point cloud is defined in a tree structure having a plurality of nodes having parent-child relationships and that represent the geometry of a volumetric space recursively split into sub-volumes and containing the points of the point cloud. Occupancy of sub-volumes of a volume is indicated using a bit sequence with each bit of the bit sequence indicating occupancy of a respective sub-volume in a scan order within the volume, and a volume has a plurality of neighbouring volumes. The operations of method 4100 described below are each performed for a current node associated with a current volume split into sub-volumes, wherein each sub-volume corresponds to a child node of the current node. In operation 4110, the bit sequence indicating the occupancy of the sub-volumes of the current volume is determined. Then, for at least one bit in the bit sequence of the current volume, the following operations are performed. In operation 4120, a sub-volume neighbour configuration is determined based on occupancy data for sub-volumes of at least one neighbouring volume of the current volume. The sub-volume neighbour configuration depends on an occupancy pattern of a group of sub-volumes of the at least one neighbouring volume that neighbour a given sub-volume of the current volume. The given sub-volume of the current volume is that sub-volume that corresponds to the bit in the bit sequence. For example, for bit $b_i$ of the bit sequence, the given sub-volume is that sub-volume of the current volume that corresponds to said bit $b_i$, i.e., the given sub-volume is that sub-volume for which the bit $b_i$ indicates the occupancy status. The sub-volume neighbour configuration is then determined for the considered sub-volume of the current volume. Notably, operation 4120 may be performed for any, some, or all of the bits of the bit sequence. In operation 4130, a probability (e.g., context) for use in entropy encoding of the bit in the bit sequence is selected. Here, the selecting is based at least in part on the sub-volume neighbour configuration that has been determined for the sub-volume that corresponds to the bit in the bit sequence. In operation 4140, the bit in the bit sequence is entropy encoded based on the selected probability (e.g., context) using a binary entropy encoder to produce encoded data for the bitstream.

In some implementations, method 4100 may further include an operation (not shown in FIG. 29) of updating the selected probability (e.g., context).

As has been described above, the occupancy pattern of the current node may be entropy coded using a cascade of one or more binary entropy coders. Accordingly, operation 4130 of method 4100 may involve, for at least one bit of the bit sequence, selecting a respective probability (and correspondingly, an associated entropy coder) for coding that bit based at least in part on the sub-volume neighbour configuration that has been determined for the sub-volume that corresponds to the bit to be entropy coded. In addition, selecting this probability may be based on a partial sequence of already coded bits of the bit sequence and/or on the neighbour configuration for the current volume. Put differently, for each bit of the bit sequence, a context may be selected based on the sub-volume neighbour configuration and in addition, selecting the context may be based on a partial sequence of already coded bits of the bit sequence and/or the neighbour configuration for the current volume. In terms of context, operation 4130 of method 4100 may be said to relate to selecting a context for entropy coding the bit based at least in part on the sub-volume neighbour configuration that has been determined for the sub-volume that corresponds to the bit to be coded. Then, in some implementations this context may be updated after operation 4140.

Figure 30:
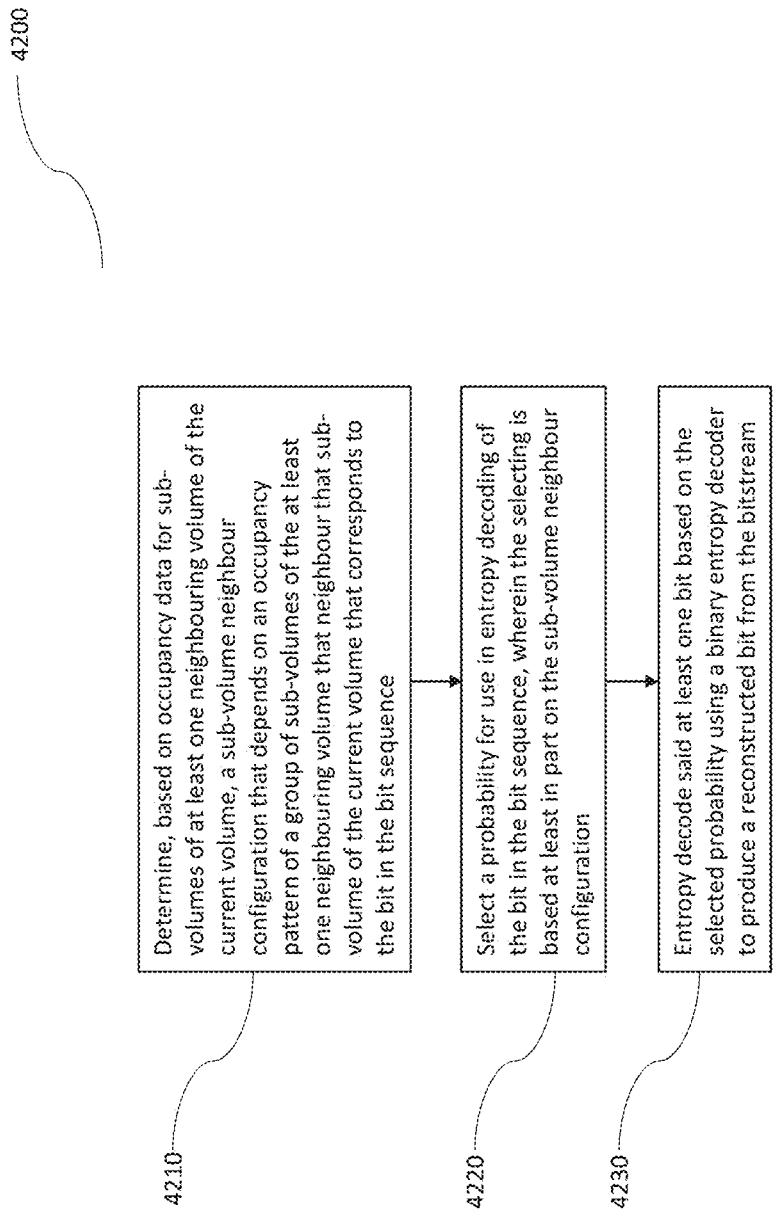
FIG. 30 shows, in flowchart form, a method of decoding an occupancy pattern of a current node based at least in part on the sub-volume neighbor configuration.

Reference is now made to FIG. 30, which shows, in flowchart form, an example of a method 4200 of decoding a bitstream of compressed point cloud data to produce a reconstructed point cloud. The point cloud is defined in a tree structure (e.g., an octree) having a plurality of nodes having parent-child relationships and that represent the geometry of a volumetric space recursively split into sub-volumes and containing the points of the point cloud. Occupancy of sub-volumes of a volume is indicated using a bit sequence with each bit of the bit sequence indicating occupancy of a respective sub-volume in a scan order within the volume, and a volume has a plurality of neighbouring volumes. The operations of method 4200 described below are each performed for a current node associated with a current volume split into sub-volumes, wherein each sub-volume corresponds to a child node of the current node, and for at least one bit in the bit sequence of the current volume. In operation 4210, a sub-volume neighbour configuration is determined based on occupancy data for sub-volumes of at least one neighbouring volume of the current volume. The sub-volume neighbour configuration depends on an occupancy pattern of a group of sub-volumes of the at least one neighbouring volume that neighbour a given sub-volume of the current volume, the given sub-volume being that sub-volume of the current volume that corresponds to the bit in the bit sequence. For example, for bit $b_i$ of the bit sequence, the given sub-volume is that sub-volume of the current volume that corresponds to said bit $b_i$, i.e., the given sub-volume is that sub-volume is considered for which the bit $b_i$ indicates the occupancy status. The sub-volume neighbour configuration is then determined for the considered sub-volume of the current volume. Notably, operation 4120 may be performed for any, some, or all of the bits of the bit sequence. In operation 4220 a probability (e.g., context) for use in entropy decoding of the bit in the bit sequence is selected. This selecting is based at least in part on the sub-volume neighbour configuration. In operation 4230 said at least one bit is entropy decoded based on the selected probability (e.g., context) using a binary entropy decoder to produce a reconstructed bit from the bitstream.

In some implementation, method 4200 may further include an operation (not shown in FIG. 30) of updating the selected probability (e.g., context).

In the same manner as for encoding, operation 4220 of method 4200 may involve, for at least one bit of the bit sequence representing the occupancy pattern, selecting a respective probability (and correspondingly, an associated entropy coder) for coding that bit based at least in part on the sub-volume neighbour configuration that has been determined for the sub-volume that corresponds to the bit to be entropy coded. In addition, selecting this probability may be based on a partial sequence of already coded bits in the bit sequence and/or on the neighbour configuration for the current volume. Put differently, for each bit of the bit sequence, a context may be selected based on the sub-volume neighbour configuration and in addition, selecting the context may be based on a partial sequence of already coded bits in the bit sequence and/or the neighbour configuration for the current volume. In terms of context, operation 4220 of method 4200 may be said to relate to selecting a context for entropy coding the bit based at least in part on the sub-volume neighbour configuration that has been determined for the sub-volume that corresponds to the bit to be coded. Then, in some implementations this context may be updated after operation 4230.

Examples of determining the sub-volume neighbour configuration will be described hereinbelow.

In some implementations, this may involve determining the number of sub-volumes of the at least one neighbouring volume (possibly of all neighbouring volumes or of all already coded neighbouring volumes) that neighbour a sub-volume of the current volume that corresponds to the bit in the bit sequence based on the occupancy data for the sub-volumes of the at least one neighbouring volume of the current volume. This number will be referred to as NT[i] below, where i is an index indicating the sub-volume of the current volume (or the corresponding bit $b_i$ in the bit sequence). In this sense, selecting the probability in operation 4130 of method 4100 and in operation 4220 of method 4200 may be said to relate to selecting the probability based at least in part on the number NT[i].

In some implementation, determining the sub-volume neighbour configuration may further involve applying a threshold function to the determined number NT[i].

Figure 31:
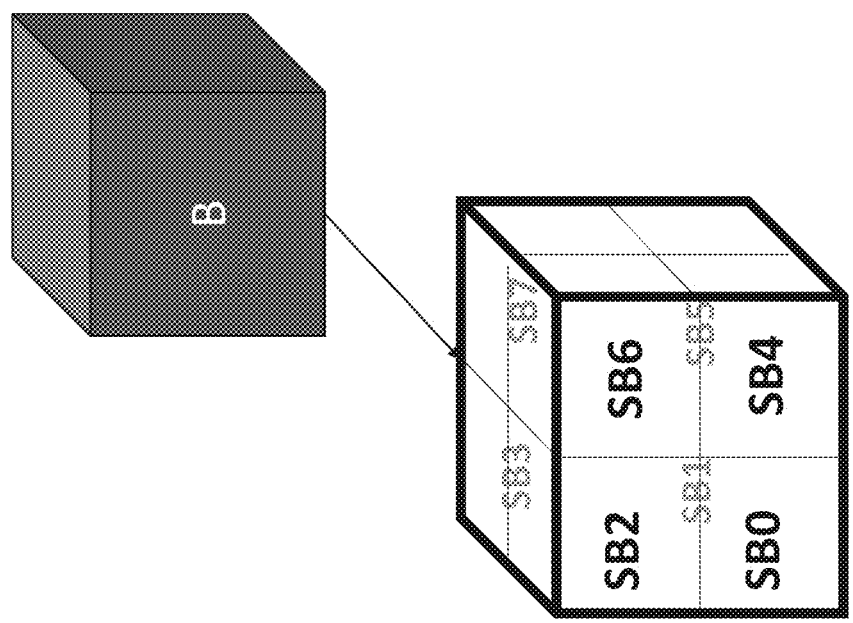
FIG. 31 shows an example of how a volume associated with a current node is split into sub-volumes.

Reference is made to FIG. 31 which shows an example of the split of the current volume (current node) B into eight sub-volumes (sub-nodes) SB0 to SB7. For this example, neighbouring volumes are defined as volumes sharing a face with each other (i.e., that "touch" each other). Each of the sub-volumes (or child volumes) of the current volume B is neighboured (touched) by three sub-volumes of the current volume's neighbours. The sub-volume neighbour configuration for each sub-volume SB0 to SB7 (SBi, i=0, . . . , 7) may depend on the occupancy pattern of the group of sub-volumes that touch the respective sub-volume SBi of the current volume. Depending on the occupancy pattern of the current volume's occupied neighbours, up to three occupied sub-volumes of the current volume's occupied neighbours may neighbour (or touch, where touching/neighbouring is defined as sharing a face) the respective sub-volume SBi.

One example process of determining the sub-volume neighbour configuration for a given sub-volume SBi of the current volume that uses the above definition of neighbouring volumes involves determining a number $0 \leq NT[i] \leq 3$ of sub-volumes in neighbours of the current volume that touch the respective sub-volume SBi. Put differently, the number NT[i] for a sub-volume SBi of the current volume indicates the number of occupied sub-volumes, in the current volume's neighbours, that neighbour (touch, i.e., share a face with) the sub-volume SBi.

By the above definition, the integer number $0 \leq NT[i] \leq 3$ for a sub-volume SBi of the current volume is the number of occupied sub-volumes (child nodes) that are located in (already coded) neighbours of the current volume and that intersect the sub-volume SBi in a face (i.e., that touch the sub-volume SBi).

In a preferred implementation, the neighbours are the six neighbours sharing a face with the current cube, and child nodes of occupied neighbours are said to neighbour the sub-node SBi if and only if one of their faces is included in a face of the cube associated with the sub-node SBi (i.e., if the child node of an occupied neighbour intersects the sub-node SBi in a face). Nevertheless, it is to be understood that the present application is not limited to the aforementioned implementation of an octree and a definition of a neighbour as a node whose associated volume shares a face with the associated volume of a current, same-level node. In fact, the application relates to any tree representing the geometry of a point cloud. Moreover, neighbours of a current node may be generally defined as nodes at the same depth or level (relative to the root node of the tree) as the current node and whose associated volume intersects the volume of the current node (e.g., at least in a predefined non-empty set). In a tree where volumes associated with nodes are cubes (such as an octree, for example), this intersection may be a face, an edge, a vertex or any non-empty set of points.

Similarly, occupied child nodes of a neighbour of a current node are said to intersect a sub-node SB of the current node B if the intersection of the volume associated with the child node and the volume associated with the sub-node SB is a non-empty set of points. Again, in a tree where volumes associated with nodes are cubes (such as an octree, for example), this intersection may be a face, an edge, a vertex or any non-empty set of points.

It is also to be understood that the neighbour definition for neighbours and for child nodes of neighbours may be different. For example, in an octree, neighbours may be defined as nodes sharing a face with the current node, thus leading to six neighbours; however, the number NT[i] may count the number of child nodes of already-coded occupied neighbours that share at least an edge with the sub-node SBi. Nevertheless, preferred implementations may use the definition of intersection as "share a face with" for both neighbours and child nodes of neighbours.

As noted above, different definitions of neighbouring nodes or volumes may be used in the context of the present application. Depending on the neighbour definition, possible ranges for the number NT[i] would be different from 0≤NT[i]≤3 (which applies to the case of neighbouring volumes being defined as volumes sharing a face, or "touching"). For example, if neighbouring volumes are defined as volumes that intersect each other at least in an edge, one would have 0≤NT[i]≤12. Likewise, if neighbouring volumes are defined as volumes that intersect each other at least in a vertex, one would have 0≤NT[i]≤19.

Figure 32:
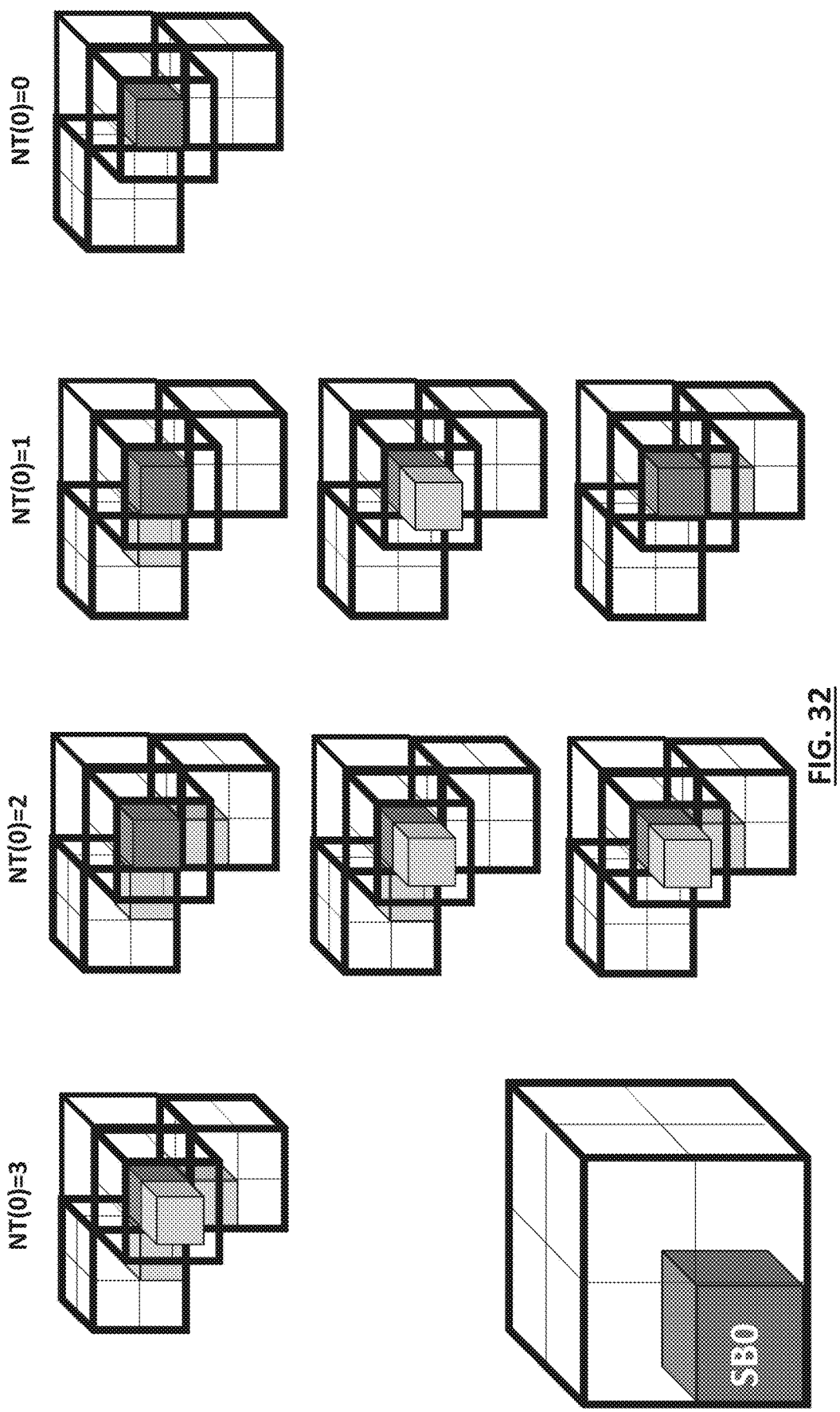
FIGS. 32 to 35 show examples of sub-volume neighbour configurations for different sub-nodes of the current node.

As noted above, depending on the occupancy pattern of the current volume's occupied neighbours, up to three occupied sub-volumes of the current volume's occupied neighbours may neighbour the respective sub-volume (sub-node) SBi, using the neighbouring definition of neighbouring volumes being volumes that share a face. FIG. 32 shows that for the sub-node SB0 of the current node B, assuming the scan order described above with reference to FIG. 27, there are up to three occupied child nodes of neighbour nodes that may neighbour the sub-volume associated with sub-node SB0 (i.e., that may intersect the sub-volume associated with sub-node SB0 in a face). The eight possible occupied child node configurations are depicted in the figure as well as the associated value NT[0] which is either 0, 1, 2 or 3.

Figure 33:
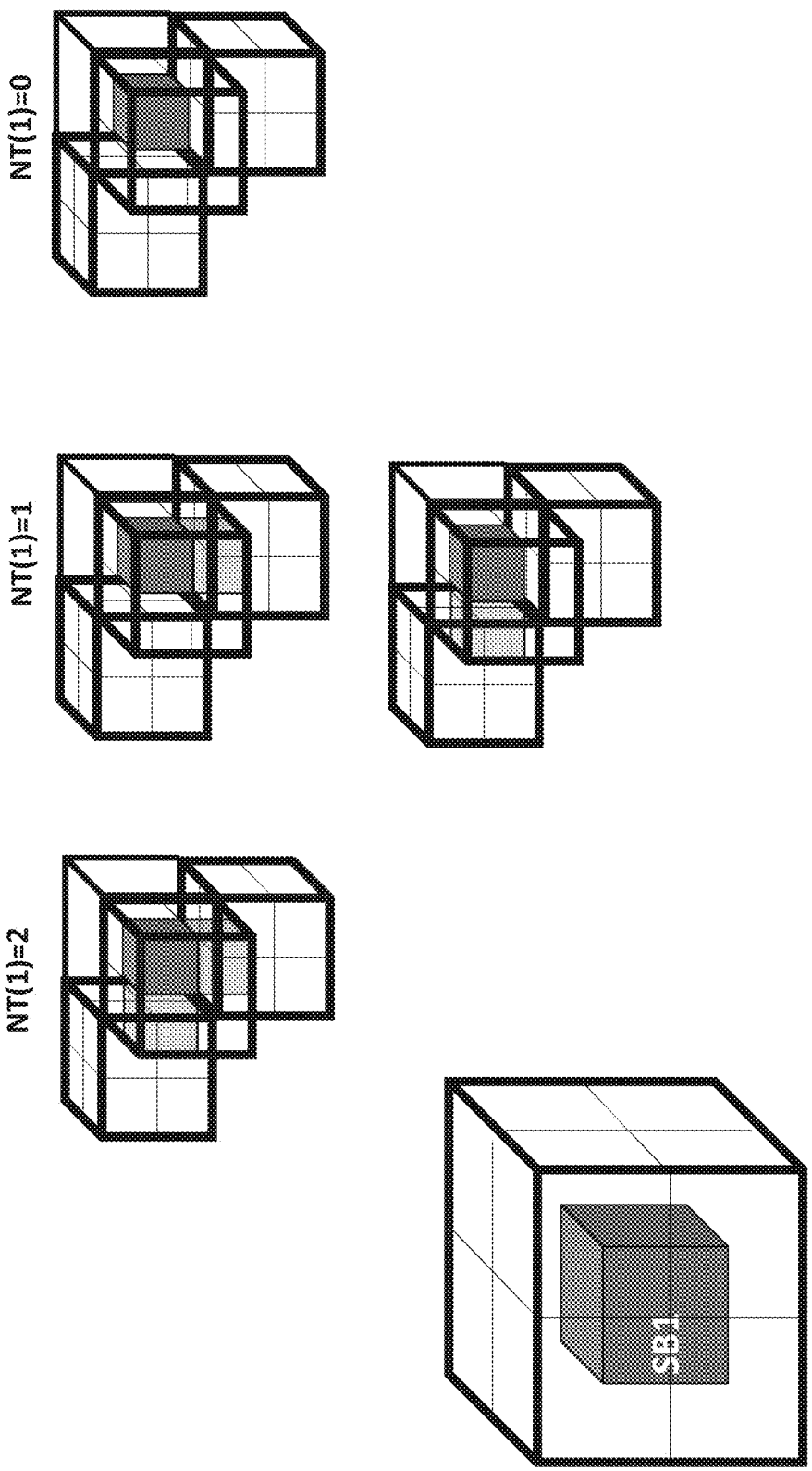

FIG. 33 shows that for the sub-node SB1 of the current node B, there are up to two occupied child nodes of neighbour nodes that may neighbour (i.e., intersect in a face) the sub-volume associated with sub-node SB1. The four possible occupied child node configurations are depicted in the figure as well as the associated value NT[1] which is either 0, 1, or 2.

Figure 34:
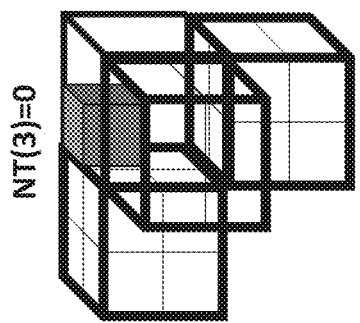
Figure 34:
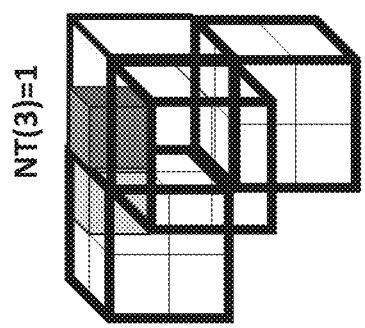
Figure 34:
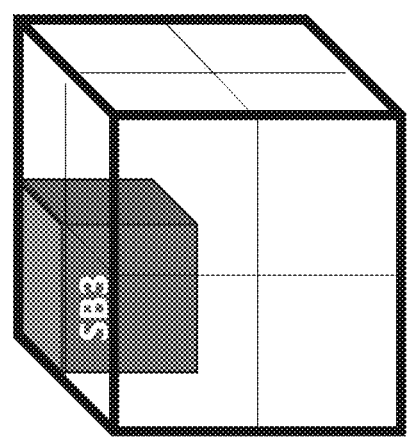

FIG. 34 shows that for the sub-node SB3 of the current node B, there are up to one occupied child nodes of neighbour nodes that may neighbour (i.e., intersect in a face) the sub-volume associated with sub-node SB3. The two possible occupied child node configurations are depicted in the figure as well as the associated value NT[3] which is either 0, or 1.

Figure 35:
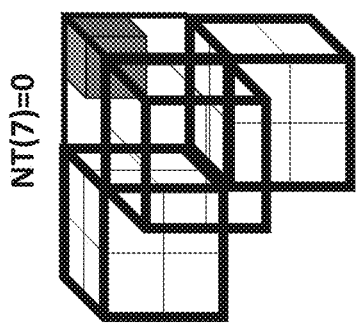
Figure 35:
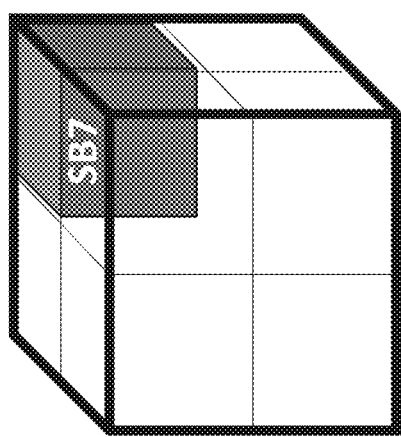

FIG. 35 shows that for the sub-node SB7 of the current node B, there is no occupied child node of neighbour nodes that may neighbour (i.e., intersect in a face) the sub-volume associated with sub-node SB7. Therefore, there is only one possible occupied child node configuration as depicted in the figure, i.e. the value of NT[7] is necessarily 0. In this case, the child nodes provide no extra information for context determination in the coding of the occupancy information of the sub-node SB7.

Once the number NT[i] has been determined for sub-node SBi of the current node, a sub-volume neighbour configuration value C[i] may be determined from NT[i] by applying a threshold function. The threshold function may be a function that outputs its input value up to a certain threshold, and that outputs the threshold value for input values beyond the threshold. For example, the threshold may be set to 2, so that C[i]=0 if NT(i)=0
C[i]=1 if NT(i)=1
C[i]=2 if NT(i)>=2

With this thresholding operation, possible values for C[0] include 0,1 or 2, whereas C[7] is always 0. It is understood that other thresholding operations and threshold functions are feasible as well. In particular, for other neighbour definitions, the value range for the number NT[i] would be different from 0≤NT[i]≤3 and a different threshold may be applied.

Selecting the probability (e.g., context) in operation 4130 of method 4100 and in operation 4220 of method 4200 may then relate to selecting the probability based at least in part on the sub-volume neighbour configuration value C[i]. In this sense, the sub-volume neighbour configuration value C[i] may be said to correspond to the sub-volume neighbour configuration.

Figure 36:
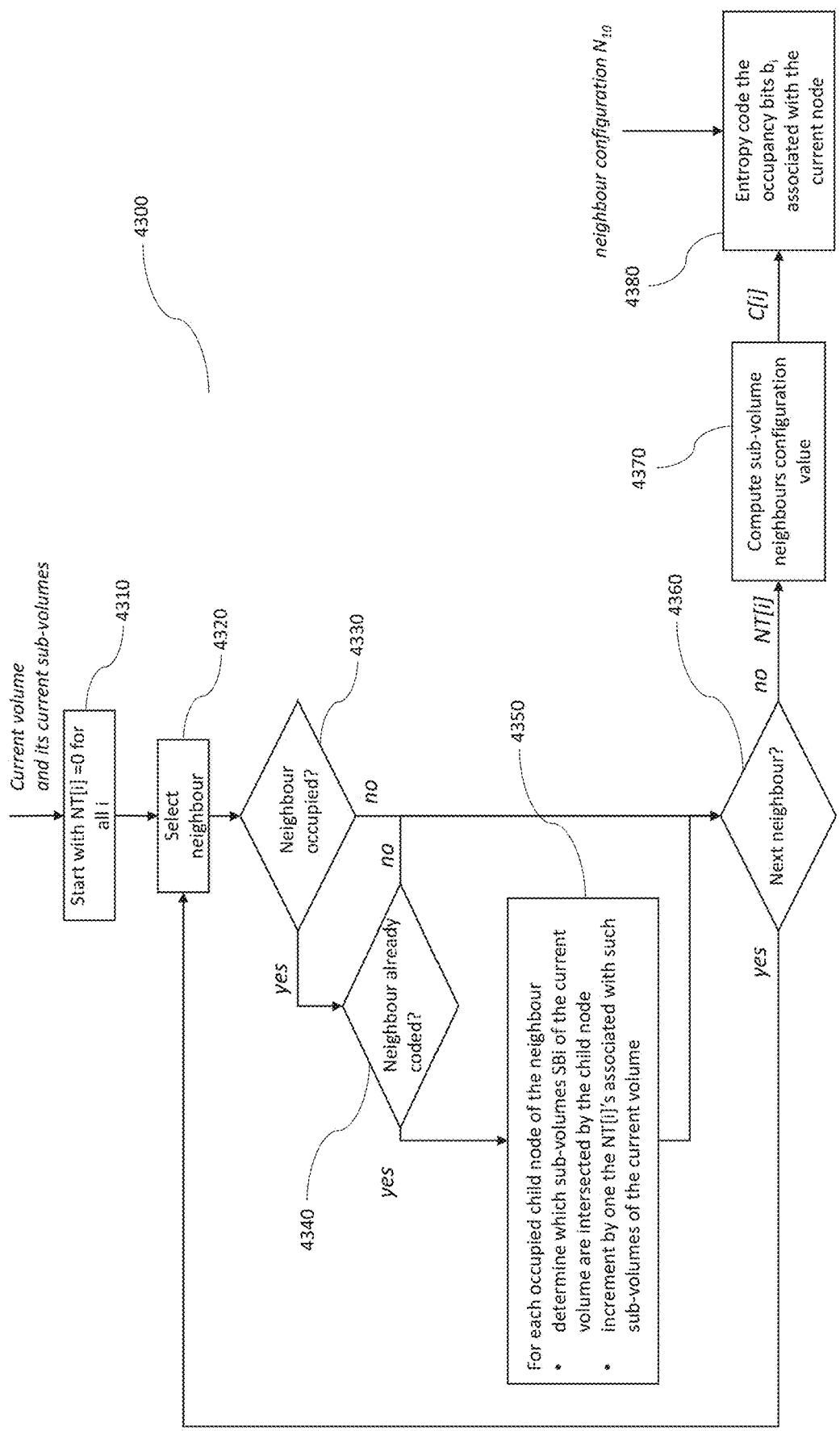
FIG. 36 shows, in flowchart form, a method of determining the sub-volume neighbour configurations for the sub-nodes of the current node.

Reference is now made to FIG. 36 which shows one example, in flowchart form, of a method 4300 of determining the number NT[i] and the sub-volume neighbour configuration value C[i] for the sub-volumes of a current volume. That is, method 4300 operates on the sub-volumes of the current volume. In operation 4310, the number NT[i] is initialized to zero for all sub-volumes of the current volume. Then, in operation 4320, a neighbour of the current volume is selected. In operation 4330, it is checked whether the selected neighbour is occupied. If the selected neighbour is occupied (yes in operation 4330), the method proceeds to operation 4340. In operation 4340, it is checked whether the selected occupied neighbour has already been coded. If so (yes in operation 4340), the method proceeds to operation 4350. In operation 4350, it is determined, for each occupied child node (sub-volume) of the neighbour, which sub-volumes of the current volume are neighboured (depending on the neighbour definition; e.g., intersected at least in a predefined non-empty set) by that child node. For each sub-volume of the current volume that is neighboured by the child node, the corresponding number NT[i] is incremented by one. Subsequently, the method proceeds to operation 4360. If the selected neighbour is not occupied (no in operation 4330) or not already coded (no in operation 4340), the method proceeds to operation 4360 as well. In operation 4360, it is checked whether there are neighbours of the current volume that have not yet been selected. If so (yes in operation 4360), the method returns to operation 4320 to select the next neighbour of the current volume. Once all neighbours have been processed (no in operation 4360), the sub-volume neighbour configuration value C[i] is calculated for each sub-volume of the current volume in operation 4370. This may involve applying a threshold function. Then, in operation 4380, respective bits $b_i$ of the bit sequence may be entropy coded using a probability (e.g., context) based on the sub-volume neighbour configuration value C[i], and possibly based on a partial sequence of already coded bits in the bit sequence and/or the (reduced) neighbour configuration.

In alternative implementations, instead of a loop over neighbours of the current volume, a loop over the sub-volumes SBi of the current volume (or equivalently, over the index i) may be performed. Then, for each sub-volume SBi, occupied child nodes of already coded neighbours are tested for whether they neighbour with the sub-volume SBi (e.g., intersect at least in a predefined non-empty set), and NT[i] is obtained as the number of such child nodes that neighbour the sub-volume SBi.

In the above determination of NT[i], all neighbours of the sub-volume of the current volume are treated equally, regardless of their intersection with said sub-volume. In some implementations, different weights may be applied to neighbours with different intersections with the sub-volume in question. For example, when applying a broader neighbour definition, a neighbouring sub-volume that shares a face with the sub-volume in question may have a higher weight that a neighbouring sub-volume that shares (only) an edge with the sub-volume in question, which in turn may have a higher weight than a neighbouring sub-volume that shares (only) a vertex with the sub-volume in question. These different weights then can be applied when determining a weighted number NT'[i], wherein each neighbour of the sub-volume in question is counted with its respective weight in the sum that leads to the weighted number NT'[i].

Accordingly, determining the sub-volume neighbour configuration in operation 4120 of method 4100 an in operation 4210 of method 4200 may involve determining all those sub-volumes of the at least one neighbouring volume (possibly of all neighbouring volumes or of all already coded neighbouring volumes) that intersect that sub-volume of the current volume that corresponds to the bit in the bit sequence based on the occupancy data for the sub-volumes of the at least one neighbouring volume of the current volume. Further, respective weight factors may be applied to the determined sub-volumes. Each weight factor may depend on an intersection of the respective determined sub-volume with that sub-volume of the current volume that corresponds to the bit in the bit sequence. For example, a sub-volume that intersects with the sub-volume in question in a face may have a highest weight, a sub-volume that intersects with the sub-volume in question (only) in an edge may have an intermediate weight, and a sub-volume that intersects with the sub-volume in question (only) in a vertex may have a lowest weight. In some implementations, only two out of the three neighbour definitions may be considered (which effectively corresponds to setting the weight factor for neighbours of the third neighbour definition to zero). For example, respective weight factors that are applied to sub-volumes that intersect the sub-volume in a face, and edge, and a vertex may be set to 2, 1, and 0, respectively.

Then, determining the sub-volume neighbour configuration may further involve determining a weighted number NT'[i] of sub-volumes of the at least one neighbouring volume intersecting that sub-volume of the current volume that corresponds to the bit in the bit sequence based on the determined sub-volumes and their respective weight factors. That is, when summing over the determined sub-volumes of the at least one neighbouring volume that intersect that sub-volume of the current volume that corresponds to the bit in the bit sequence, each determined sub-volume may be counted with its respective weight factor. Further, thresholding may be applied to the weighted number NT'[i] to obtain a weighted sub-volume neighbour configuration value C'[i].

In some implementations, the probability (e.g., context) associated with the binary entropy coder that codes a given occupancy bit $b_i$ in the bit sequence may be chosen depending on the values of $b_0, \ldots, b_{i-1}$
$N_{10}$
$C[i]$ That is, once determined, the sub-volume neighbour configuration values C[i] (or weighted sub-volume neighbour configuration values C'[i]) may be used as input to the entropy coder(s) that codes the occupancy bits $b_i$ associated with the sub-nodes SBi of the current node B.

Context Reduction Operations

The above examples propose that the coding process include a context reduction operation with respect to at least one bit of the occupancy pattern so as to reduce the set of available contexts to a smaller set of available contexts. In this sense, the "context reduction operation" may be understood as identifying and consolidating contexts that may be deemed duplicative or redundant in the circumstances of a particular bit $b_i$. As noted above, the reduced context set may be determined in advance of coding and may be provided to the encoder and decoder, and the encoder and decoder determine whether to use the reduced context set based on the same conditions described below for reducing the context set.

Neighbour Configuration Reduction Through Screening/Shielding

A first example context reduction operation involves reducing the number of neighbour configurations based on screening/shielding. In principle, the neighbour configuration factors occupancy status of neighbouring volumes into the context selection process on the basis that the neighbouring volumes help indicate whether the current volume or sub-volume is likely to be occupied or not. As the bits associated with sub-volumes in the current volume are decoded, then they are also factored into the context selection; however, the information from nearby sub-volumes may be more significant and more informative than the occupancy information of a neighbouring volume that is located on the other side of the sub-volumes from the current sub-volume. In this sense, the previously-decoded bits are associated with sub-volumes that "screen" or "shield" the neighbouring volume. This may mean that in such circumstances, the occupancy of the neighbouring volume can be ignored since the relevance of its occupancy status is subsumed by the occupancy status of the sub-volumes between the current sub-volume and the neighbouring volume, thereby permitting reduction of the number of neighbour configurations.

Figure 24:
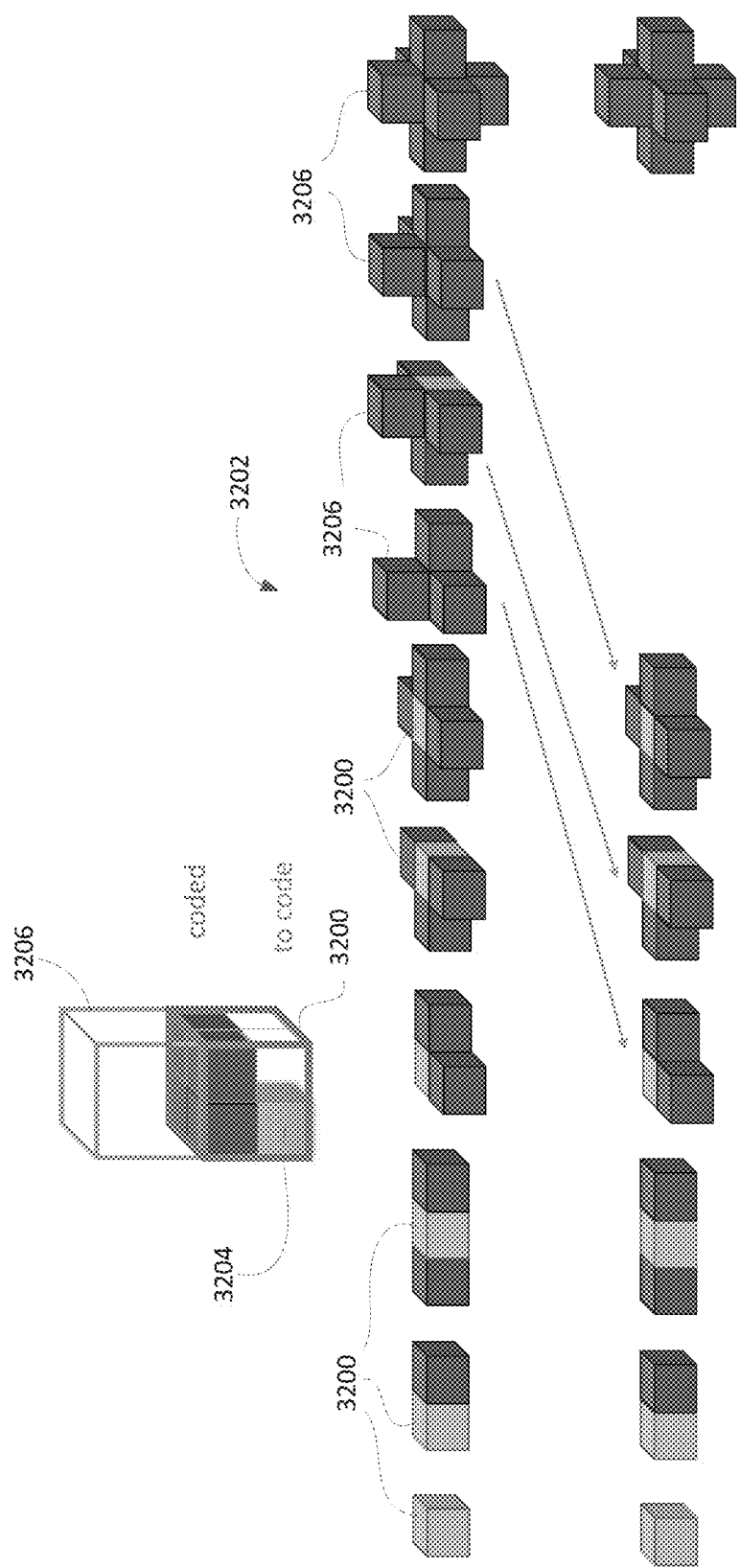
FIG. 24 diagrammatically shows an example context reduction operation based on neighbour screening.

Reference is now made to FIG. 24, which diagrammatically shows an example context reduction operation based on neighbour screening. The example involves coding the occupancy pattern for a volume 3200. The occupancy pattern signals the occupancy status of the eight sub-volumes within the volume 3200. In this example, the four sub-volumes in the top half of the volume 3200 have been coded, so their occupancy status is known. The bit of the occupancy pattern being coded is associated with a fifth sub-volume 3204 that is located in the bottom half of the volume 3200, below the four previously-coded sub-volumes.

The coding in this example includes determining context based on neighbour configuration. The 10 neighbour configurations 3202 are shown. The volume 3200 containing the fifth sub-volume 3204 to be coded is shown in light grey and indicated by reference numeral 3200. The neighbour configurations 3202 are based on the occupancy status of the volumes adjacent to the volume 3200 and sharing a face with it. The neighbouring volumes include a top neighbouring volume 3206.

In this example, the number of neighbour configurations can be reduced from 10 to 7 by ignoring the top neighbouring volume 3206 in at least some of the configurations. As shown in FIG. 24, three of the four configurations in which the top neighbouring volume 3206 is shown can be subsumed under equivalent configurations that do not factor in the top neighbouring volume 3206, thereby reducing the number of neighbour configurations to 7 total. It may still be advantageous to keep the configuration showing all six neighbouring volumes since there is no existing 5-volume neighbour configuration that the 6-volume configuration can be consolidated with (having eliminated the 5-element one) meaning that even if the top neighbouring volume is removed a new 5-element neighbour configuration results and no overall reduction in contexts occurs.

The top neighbouring volume 3206 can be eliminated from the neighbour configurations in this example because the context determination for coding of an occupancy bit associated with the fifth sub-volume 3204 will already take into account the occupancy status of the four previously-coded sub-volumes directly above it, which are a better indication of likelihood and directionality of occupancy for the fifth sub-volume than the occupancy status of the more-distant top neighbouring volume 3206.

The above example in which the top neighbouring volume 3206 is screened or shielded by the previously-coded sub-volumes when coding the occupancy bit corresponding to the fifth sub-volume 3204 is only one example. Depending on coding order within the volume 3200 a number of other possible screening/shielding situations may be realized and exploited to reduce the available neighbour configurations.

Figure 25:
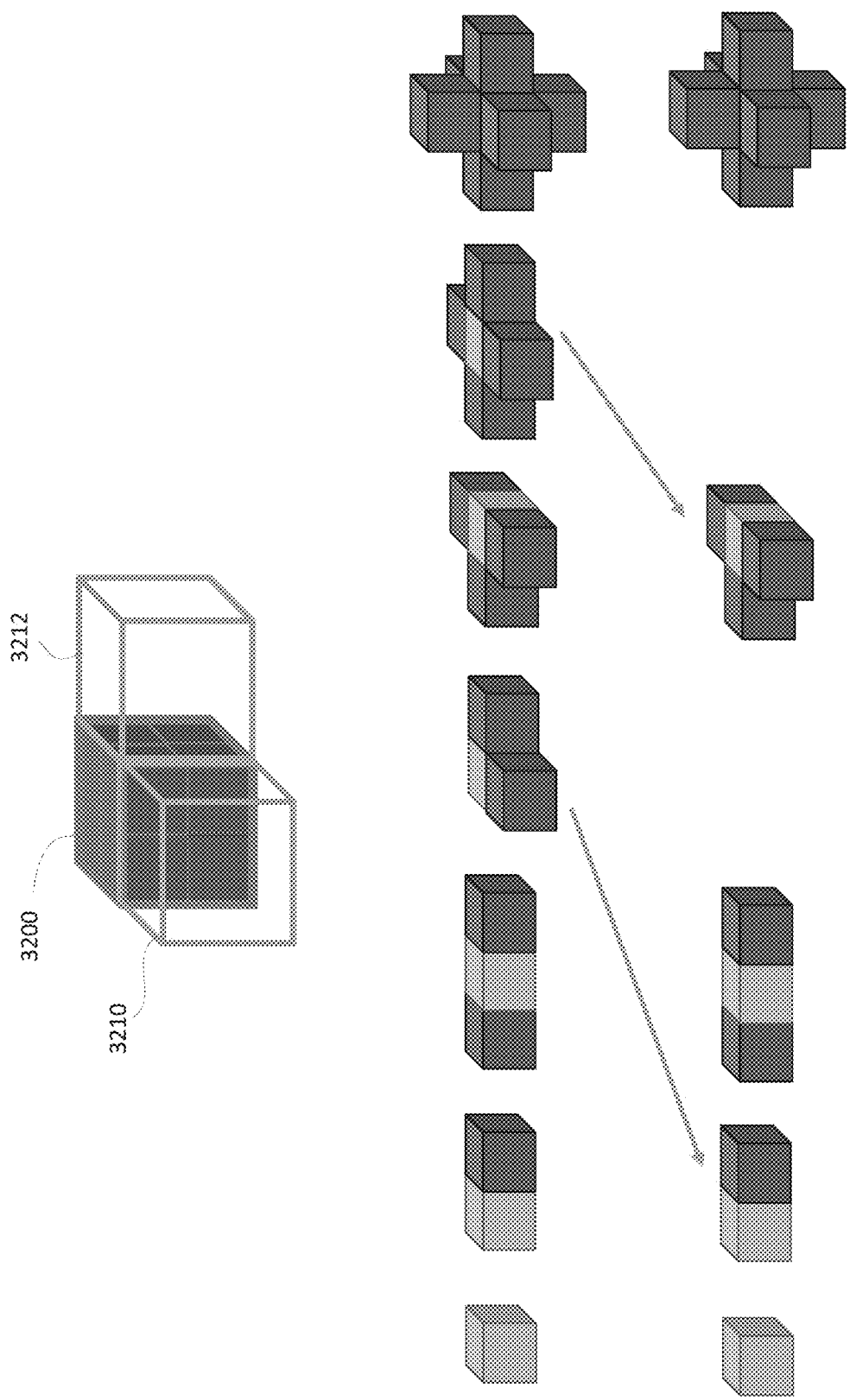
FIG. 25 shows another example context reduction operation based on neighbour screening.

Reference is now made to FIG. 25, which shows a second example of screening/shielding. In this example, the occupancy pattern for the volume 3200 is nearly completely coded. The sub-volume to be coded is the eighth sub-volume and is hidden in the figure at the back bottom corner (not visible). In this case, the occupancy status of all seven other sub-volumes has been coded. In particular, the sub-volumes along the top (hence the reduction in neighbour configurations to seven total) and along the right side and front side. Accordingly, in addition to screening the top neighbouring volume, the sub-volumes with previously-coded occupancy bits shield a front neighbouring volume 3210 and a right-side neighbouring volume 3212. This may permit the reduction of neighbour configurations from seven total to five total, as illustrated.

It will be appreciated that the two foregoing examples of shielding are illustrative and that in some cases different configurations may be consolidated to account for different shielding situations. The context reduction operation based on shielding/screening by previously-coded sub-volumes is general and not limited to these two examples, although it will be appreciated that it cannot be applied in the case of the first sub-volume to be coded since it requires that there by at least one previously-coded occupancy bit associated with a nearby sub-volume in order for there to be any shielding/screening.

It will also be appreciated that the degree of shielding/screening to justify neighbour configuration reduction may be different in different implementations. In the two above examples, all four sub-volumes sharing a face with a neighbouring volume were previously-coded before that neighbouring volume was considered shielded/screened and thus removed from the neighbour configurations. In other examples, partial shielding/screening may be sufficient, e.g. from one to three previously-coded sub-volumes that share a face.

Context Reduction Through Special Case Handling

There are certain cases in which context reduction may occur without loss of useful information. In the example context determination process described above, the context for coding an occupancy bit is based on the neighbour configuration, i.e. the pattern of occupancy of volumes neighbouring the current volume, and on the partial pattern attributable to the occupancy of sub-volumes in the current volume that were previously coded. That latter condition results in $2^7=128$ contexts to track with respect to the eighth bit in the occupancy pattern bit sequence. Even if neighbour configurations are reduced to five total, this means 640 contexts to track.

The number of contexts is large based on the fact that the previously-coded bits of the bit sequence have an order, and the order is relevant in assessing context. However, in some cases, the order may not contain useful information. For example, in the case where the neighbour configuration is empty, i.e. $N_{10}=0$, any points within the volume may be presumed to be sparsely populated, meaning they do not have a strong enough directionality to justify tracking separate contexts for different patterns of occupancy in the sibling sub-volumes. In the case of an empty neighbourhood, there is no local orientation or topology to the point cloud, meaning the $2^j$ conditions based on previously-coded bits of the bit sequence can be reduced to j+1 conditions. That is, the context for coding one of the bits of the bit sequence is based on the previously-coded bits, but not on their ordered pattern, just on their sum. In other words, the entropy expression in this special case may be expressed as:

$$H(b|n) \approx H(b_0|0)H(b_1|0,b_0)H(b_2|0,b_0+b_1) \ldots H(b_7|0, b_0+b_1+\ldots+b_6)$$

In some implementations, a similar observation may be made with respect to a full neighbour configuration. In some examples, a full neighbour configuration lacks directionality, meaning the order of previously-coded bits need not be taken into account in determining context. In some examples, this context reduction operation may be applied to only some of the bits in the bit sequence, such as some of the later bits in the sequence. In some cases, the application of this context reduction operation to later bits may be conditional on determining that the earlier bits associated with previously-coded sub-volumes were also all occupied.

Statistical-Based Context Reduction

A statistical analysis may be used to reduce contexts through determining which ones lead to roughly the same statistical behaviour and then combining them. This analysis may be performed a priori using test data to develop a reduced context set that is then provided to both the encoder and decoder. In some cases, the analysis may be performed on a current point cloud using two-pass coding to develop a custom reduced context set for the specific point cloud data. In some such cases, the mapping from the non-reduced context set to the custom reduced context set may be signalled to the decoder by using a dedicated syntax coded into the bitstream.

Two contexts may be compared through a concept of "distance". A first context c has a probability p of a bit b being equal to zero, and a second context c' has a probability p' of a bit b' being equal to zero. The distance between c and c' is given by:

$$d(c, c') = |p \log_2 p - p' \log_2 p'| + |(1-p)\log_2(1-p) - (1-p')\log_2(1-p')|$$

Using this measurement of similarity (distance) the contexts may then be grouped in a process, such as:

1. Start with $M_1$ contexts and fix a threshold level $\varepsilon$
2. For a given context, regroup into a class all contexts that have a distance from the given context lower than the threshold level $\varepsilon$
3. Repeat 2 for all non-regrouped contexts until all are put into a class
4. Label the $M_2$ classes from 1 to $M_2$: this results in a brute force reduction function that maps $\{1, 2, \ldots, M_1\} \rightarrow [1, 2, \ldots, M_2]$ where $M_1 \geq M_2$.

The brute force reduction function for mapping a set of contexts to a smaller set of contexts may be stored in memory to be applied by the encoder/decoder as a context reduction operation during coding. The mapping may be stored as a look-up table or other data structure. The brute force reduction function may be applied only for later bits in the bit sequence (pattern), for example.

Combinations and Sub-combinations of Context Reduction Operations

Three example context reduction operations are described above. Each of them may be applied individually and independently in some implementations. Any two or more of them may be combined in some implementations. Additional context reduction operations may be implemented alone or in combination with any one or more of the context reduction operations described above.

Figure 26:
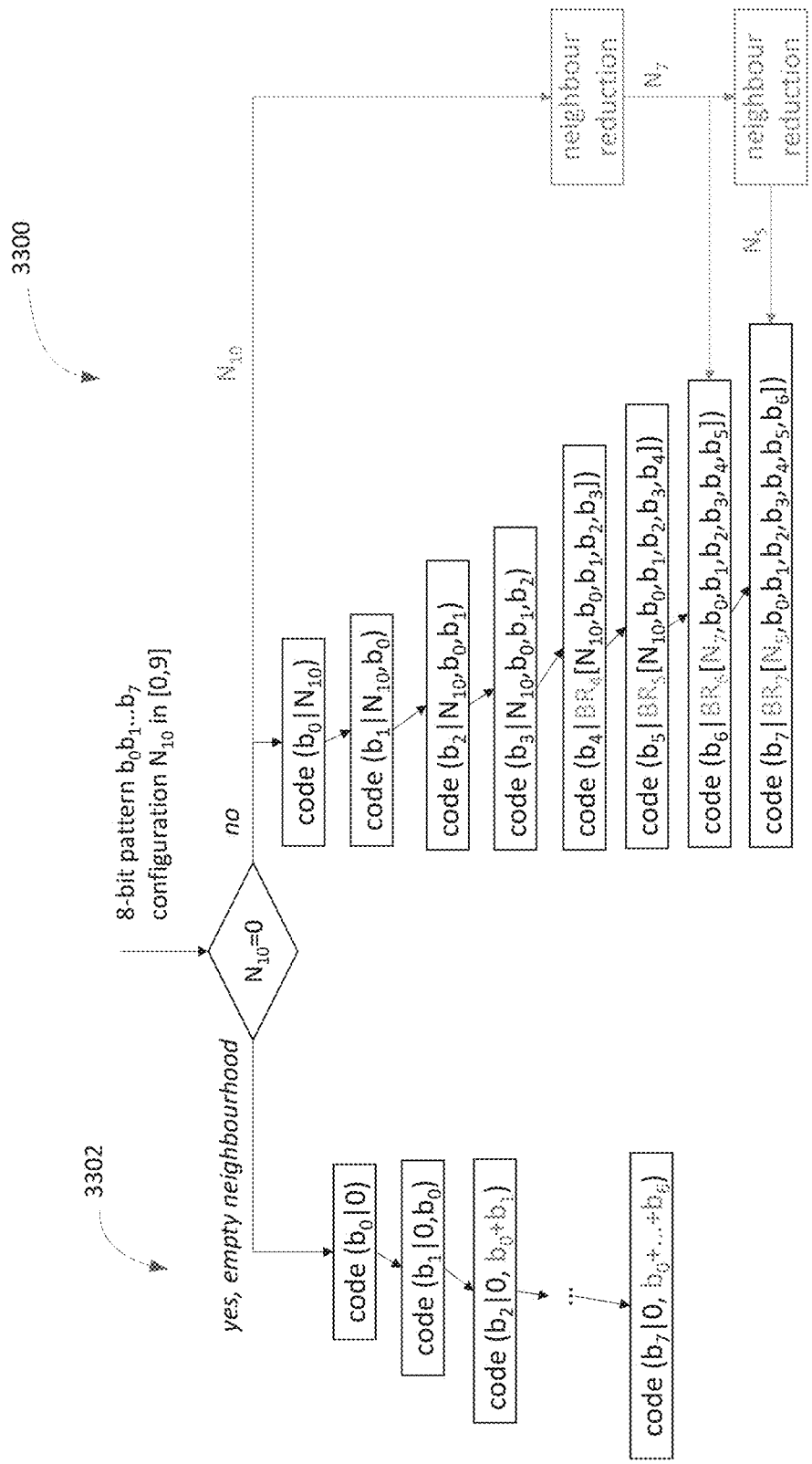
FIG. 26 shows one example, in flowchart form, of a method of binary coding occupancy patterns using combined context reduction.

FIG. 26 shows one example, in flowchart form, of a method 3300 of occupancy pattern binary coding involving combined context reduction. The method 3300 codes the 8-bit binary pattern $b_0, b_1, \ldots, b_7$, given a 10-element neighbour configuration $N_{10}$ in $\{0, 1, 2, \ldots, 9\}$. The first condition evaluated is whether the neighbour configuration is empty, i.e. $N_{10}=0$. If so, then the bits are coded without reference to their order, as indicated by reference numeral 3302. Otherwise, the bits are coded as per normal until bit $b_4$, at which point the encoder and decoder begin applying brute force context reduction functions, $BR_i$, to reduce the number of contexts by mapping the set of contexts defined by the neighbour configuration and the partial pattern of previously-coded bits to a smaller set of contexts having substantially similar statistical outcomes.

In this example, the last two bits, $b_6$ and $b_7$, are coded using reduced neighbour configurations, based on shielding/screening.

All functions may be implemented as look-up tables (LUTs) for reducing the size of the set of contexts. In one practical implementation, all the reductions are factorised in reduction functions, i.e. simply LUTs, that take the contexts as input and provide reduced contexts as output. In this example embodiment, the total number of contexts has been reduced from 2550 to 576, with the output size of each reduction function $BR_i$ being 70, 106, 110 and 119, respectively.

In summary, the dependencies (or conditions) in the conditional entropy $$H(b_i | b_0, \ldots, b_{i-1}, N_{10})$$

can be reduced by using reduction functions BRi to obtain a conditional entropy relation with less dependencies via $$H(b_i | BR_i[b_0, \ldots, b_{i-1}, N_{10}]).$$

As described above, the sub-volume neighbour configuration (e.g., the sub-volume neighbour configuration value C[i] or the weighted sub-volume neighbour configuration value C'[i]) can be used to code the occupancy bit $b_i$. In this case, the conditional entropy relation turns into $$H(b_i | b_0, \ldots, b_{i-1}, N_{10}, C[i])$$

and a reduction can be performed in analogy to the above to obtain $$H(b_i | BR_i[b_0, \ldots, b_{i-1}, N_{10}], C[i]).$$

In the above, the reduction function $BR_i$ is applied to the partial bit sequence $b_0, \ldots, b_{i-1}$ and to the 10-element neighbour configuration $N_{10}$ via $BR_i[b_0, \ldots, b_{i-1}, N_{10}]$. In some implementations, the reduction function $BR_i$ may be additionally applied to the sub-volume neighbour configuration (e.g., to the sub-volume neighbour configuration value C[i] or to the weighted sub-volume neighbour configuration value C'[i]), for example via $BR_i[b_0, \ldots, b_{i-1}, N_{10}, C[i]]$, to obtain the conditional entropy relation $$H(b_i | BR_i[b_0, \ldots, b_{i-1}, N_{10}, C[i]]).$$

In this case, the selection of the probability p (e.g., context) of a binary entropy coder that codes the occupancy bit $b_i$ may be selected depending on the value of $(BR_i[b_0, \ldots, b_{i-1}, N_{10}], C[i])$.

Figure 37:
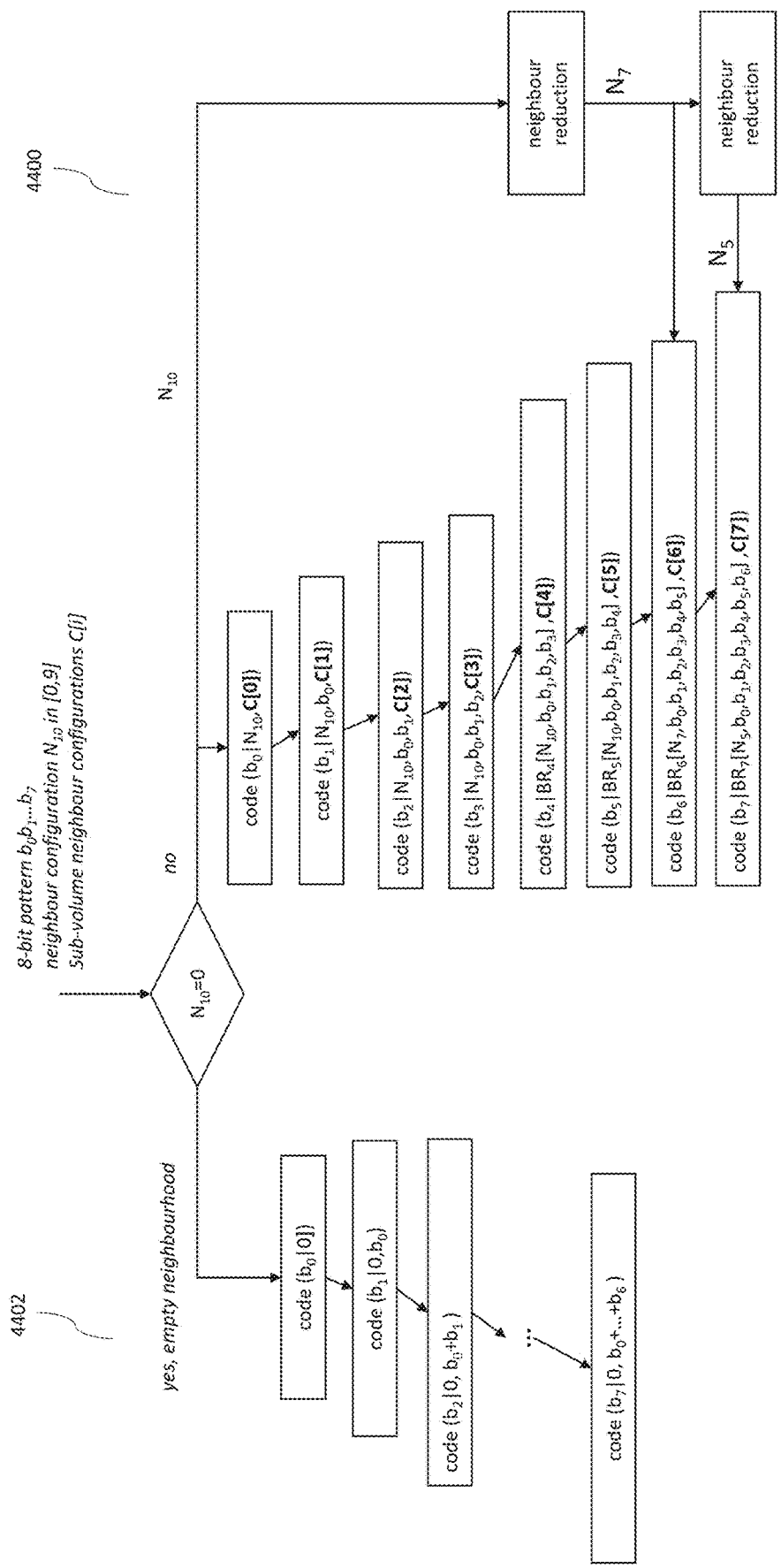
FIG. 37 shows one example, in flowchart form, of a method of binary coding occupancy patterns using combined context reduction and context determination based on the sub-volume neighbour configurations.

If the sub-volume neighbour configuration is taken into account when entropy coding the occupancy bits $b_i$, FIG. 26 described above would be modified into FIG. 37 which shows one example, in flowchart form, of a method 4400 of occupancy pattern binary coding based on the sub-volume neighbour configuration (e.g., sub-volume neighbour configuration value C[i] or weighted sub-volume neighbour configuration value C'[i]) involving combined context reduction. The method 4400 codes the 8-bit binary pattern $b_0, b_1, \ldots, b_7$, given a 10-element neighbour configuration $N_{10}$ in $\{0, 1, 2, \ldots, 9\}$ and the sub-volume neighbour configuration value C[i] (or weighted sub-volume neighbour configuration value C'[i]). The first condition evaluated is whether the neighbour configuration is empty, i.e. $N_{10}=0$. If so, then the bits are coded without reference to their order, as indicated by reference numeral 4402. Otherwise, the bits are coded as per normal until bit $b_4$, at which point the encoder and decoder begin applying brute force context reduction functions, $BR_i$, to reduce the number of contexts by mapping the set of contexts defined by the neighbour configuration and the partial pattern of previously-coded bits to a smaller set of contexts having substantially similar statistical outcomes.

In this example, the last two bits, $b_6$ and $b_7$, are coded using reduced neighbour configurations, based on shielding/screening.

All functions may be implemented as look-up tables (LUTs) for reducing the size of the set of contexts. In one practical implementation, all the reductions are factorised in reduction functions, i.e. simply LUTs, that take the contexts as input and provide reduced contexts as output.

Choice of Scan Order Within the Current Volume

Introducing the sub-volume neighbour configuration (e.g., the sub-volume neighbour configuration value C[i] or weighted sub-volume neighbour configuration value C'[i]) in the entropy coder increases the possible configurations for the conditional coding.

However, by carefully choosing the order of the scanning order of the sub-nodes SBi within the current volume B for determining the occupancy pattern, and thereby, the bit sequence to be coded, this increase can be limited. Namely, the coding of the bit $b_i$ depends on the bits $b_0$ to $b_{i-1}$, leading to $2^i$ configurations, the 10 neighbour configurations $N_{10}$, and the sub-volume neighbour configuration value C[i] (or the weighted sub-volume neighbour configuration value C'[i])

It has been shown above how to reduce the $10 \cdot 2^i$ configurations from the first two bullet points to 10, 20, 39, 76, 149, 294, 391 and 520 configurations for sub-volumes SB0 to SB7, respectively.

Now, it is clearly advantageous to first scan those sub-nodes for which the number of possible values of C[i] is maximum (e.g., three in some of the above examples). By doing so, the number of configurations for the first-scanned sub-node becomes $10 \cdot 3 = 30$ which can be considered a small increase. However, if sub-node SB0 would be scanned last, we would have obtained $520 \cdot 3 = 1560$ configurations. Therefore by carefully choosing the scanning order within the current volume (for determining the occupancy pattern, and thereby, the bit sequence to be coded), the introduction of the sub-volume neighbour configuration (e.g., sub-volume neighbour configuration value C[i] or the weighted sub-volume neighbour configuration value C'[i]) in the entropy coder has a limited impact on the number of configurations (contexts) in entropy coding.

Accordingly, in some implementations, the scan order within the current volume may be determined so that, from one sub-volume in the scan order to the next sub-volume, the maximum possible number of neighbouring sub-volumes in already coded neighbouring volumes of the current volume does not increase. In other words, the scan order may be determined so that, from one sub-volume in the scan order to the next sub-volume, the maximum possible value of the number NT[i] (or weighted number NT'[i]) does not increase.

Flag Indicating Use of the Sub-Volume Neighbour Configuration

In order to allow a low complexity profile of the coder, it may be advantageous to code a flag that signals the activation/deactivation of considering the sub-volume neighbour configuration in determining probability (e.g., context) in entropy coding the bit sequence.

Accordingly, in some implementations, the method of encoding may further include encoding a flag indicating that the probability for use in entropy encoding of at least one bit has been selected at least in part based on the sub-volume neighbour configuration. Likewise, the method of decoding may further include decoding a flag from the bitstream, the flag indicating that the probability for use in entropy decoding of at least one bit should be selected at least in part based on the sub-volume neighbour configuration.

Context Selection in Systems With Fixed Numbers of Contexts

Each of the previously described context reduction operations may be further used in a compression system with a static (fixed) minimal number of contexts. In such a design, for a given symbol in the 8-bit binary pattern, one or more reduction operations are applied to determine the context probability model with which to encode or decode the symbol.

Impact on Compression Performance

The use of 10 neighbour configurations and non-binary coding provides a compression gain over current implementations of the MPEG test model for point cloud coding. However, the above-proposed use of 10 neighbour configurations with cascaded binary coding using 2550 contexts results in an even better improvement in compression efficiency. Even when context reduction is used, such as using the three techniques detailed above, to reduce the contexts to 576 total, the binary coding compression is still marginally better than implementation using non-binary coding, and much better than the test model. This observation has been shown to be consistent across different test point cloud data.

Figure 14:
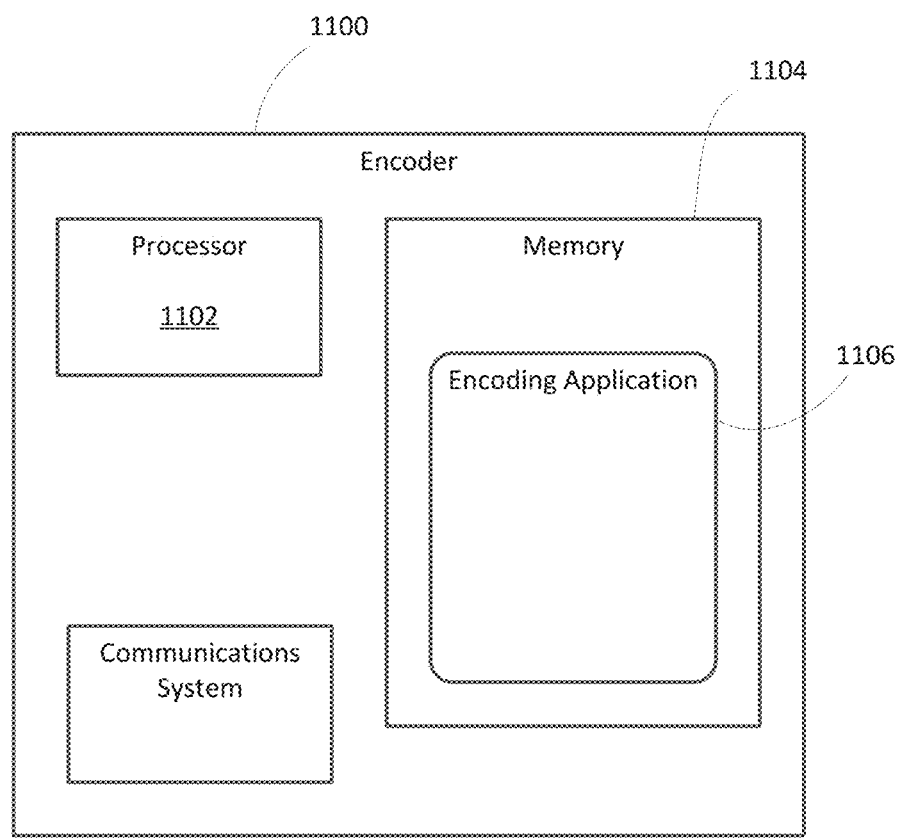
FIG. 14 shows an example simplified block diagram of an encoder.

Reference is now made to FIG. 14, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 15:
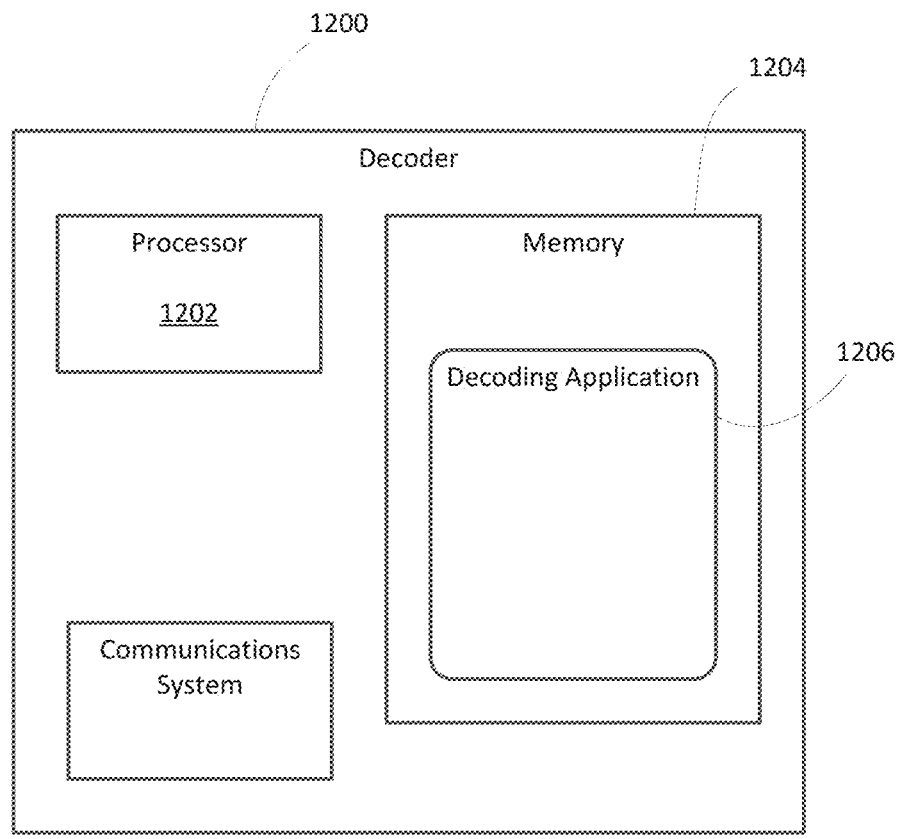
FIG. 15 shows an example simplified block diagram of a decoder.

Reference is now also made to FIG. 15, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data, wherein the method comprises:
   for each of a plurality of volumes:
      splitting a corresponding volume into sub-volumes, wherein the point cloud is defined in a tree structure having a plurality of nodes having parent-child relationships and that represent a geometry of a volumetric space recursively split into sub-volumes of volumes and containing points of the point cloud, and wherein the volumes have a plurality of neighbouring volumes; and determining a respective bit sequence indicating occupancy of the sub-volumes of the corresponding volume, wherein each bit of the respective bit sequence indicates occupancy of a respective sub-volume in a scan order within the corresponding volume, wherein for a bit in the respective bit sequence:

determining, based on occupancy data for sub-volumes of a neighbouring volume of the corresponding volume, a sub-volume neighbour configuration;

selecting, based at least in part on the sub-volume neighbour configuration, a probability for use in entropy encoding of the bit; and entropy encoding, based on the probability and using a binary entropy encoder, the bit to produce encoded data for the bitstream.

2. A method of decoding a bitstream of compressed point cloud data to produce a reconstructed point cloud, wherein the method comprises:

for a bit in a respective bit sequence of a corresponding volume:

determining, based on occupancy data for sub-volumes of a neighbouring volume of the corresponding volume, a sub-volume neighbour configuration, wherein the reconstructed point cloud is defined in a tree structure having a plurality of nodes having parent-child relationships and that represent a geometry of a volumetric space recursively split into sub-volumes of volumes and containing points of the reconstructed point cloud, wherein occupancy of the sub-volumes of the volumes is indicated using bit sequences, wherein each bit of a bit sequence in the bit sequences indicates occupancy of a respective sub-volume in a scan order within the corresponding volume, and wherein the volumes have a plurality of neighbouring volumes;

selecting, based at least in part on the sub-volume neighbour configuration, a probability for use in entropy decoding of the bit; and entropy decoding, based on the probability and using a binary entropy decoder, the bit to produce a reconstructed bit from the bitstream.

3. The method of claim 2, wherein determining the sub-volume neighbour configuration comprises:

determining a number of the sub-volumes of the neighbouring volume; and applying a threshold function to the number.

4. The method of claim 2, wherein the sub-volume neighbour configuration corresponds to a pattern of occupancy of the sub-volumes of the neighbouring volume.

5. The method of claim 2, wherein determining the sub-volume neighbour configuration further comprises further determining, based on occupancy data for sub-volumes of the neighbouring volumes that have already been coded, the sub-volume neighbour configuration.

6. The method of claim 2, wherein selecting the probability further comprises further selecting, based on a partial sequence of bits of the respective bit sequence that have already been coded and a neighbouring configuration of the corresponding volume, the probability, and wherein the neighbouring configuration corresponds to a pattern of occupancy of the neighbouring volumes.

7. The method of claim 2, wherein selecting the probability further comprises further selecting, based on a partial sequence of bits of the respective bit sequence that have already been coded, the probability.

8. The method of claim 2, wherein selecting the probability further comprises further selecting, based on a neighbouring configuration of the corresponding volume, the probability, and wherein the neighbouring configuration corresponds to a pattern of occupancy of the neighbouring volumes.

9. The method of claim 2, wherein the scan order within the corresponding volume is determined so that, from one sub-volume to the next sub-volume in the scan order, the maximum possible number of neighbouring sub-volumes in already coded neighbouring volumes of the corresponding volume does not increase.

10. The method of claim 2, wherein the tree structure represents an octree.

11. The method of claim 2, further comprising decoding a flag from the bitstream, wherein the flag indicates that the probability is to be selected at least in part based on the sub-volume neighbour configuration.

12. An encoder for encoding a point cloud to generate a bitstream of compressed point cloud data, wherein the encoder comprises:

a memory configured to store instructions; and a processor coupled to the memory and configured to execute the instructions to cause the encoder to:

for each of a plurality of volumes:

split a corresponding volume into sub-volumes, wherein the point cloud is defined in a tree structure having a plurality of nodes having parent-child relationships and that represent a geometry of a volumetric space recursively split into sub-volumes of volumes and containing points of the point cloud, and wherein the volumes have a plurality of neighbouring volumes; and determine a respective bit sequence indicating occupancy of the sub-volumes of the corresponding volume, wherein each bit of the respective bit sequence indicates occupancy of a respective sub-volume in a scan order within the corresponding volume, wherein for a bit in the respective bit sequence:

determine, based on occupancy data for sub-volumes of a neighbouring volume of the corresponding volume, a sub-volume neighbour configuration;

select, based at least in part on the sub-volume neighbour configuration, a probability for use in entropy encoding of the bit; and entropy encode, based on the probability and using a binary entropy encoder, the bit to produce encoded data for the bitstream.

13. A decoder for decoding a bitstream of compressed point cloud data to produce a reconstructed point cloud, wherein the decoder comprises:

a memory configured to store instructions; and a processor coupled to the memory and configured to execute the instructions to cause the decoder to:

for a bit in a respective bit sequence of a corresponding volume:

determine, based on occupancy data for sub-volumes of a neighbouring volume of the corresponding volume, a sub-volume neighbour configuration, wherein the reconstructed point cloud is defined in a tree structure having a plurality of nodes having parent-child relationships and that represent a geometry of a volumetric space recursively split into sub-volumes of volumes and containing points of the reconstructed point cloud, wherein occupancy of the sub-volumes of the volumes is indicated using bit sequences, wherein each bit of a bit sequence in the bit sequences indicates occupancy of a respective sub-volume in a scan order within the corresponding volume, and wherein the volumes have a plurality of neighbouring volumes;

select, based at least in part on the sub-volume neighbour configuration, a probability for use in entropy decoding of the bit; and entropy decode, based on the probability and using a binary entropy decoder, the bit to produce a reconstructed bit from the bitstream.

14. The decoder of claim 13, wherein the processor is further configured to execute the instructions to cause the decoder to:

determine a number of the sub-volumes of the neighbouring volume; and apply a threshold function to the number.

15. The decoder of claim 13, wherein the sub-volume neighbour configuration corresponds to a pattern of occupancy of the sub-volumes of the neighbouring volume.

16. The decoder of claim 13, wherein the processor is further configured to execute the instructions to cause the decoder to further determine, based on occupancy data for sub-volumes of the neighbouring volumes that have already been coded, the sub-volume neighbour configuration.

17. The decoder of claim 13, wherein the processor is further configured to execute the instructions to cause the decoder to further select, based on a partial sequence of bits of the respective bit sequence that have already been coded and a neighbouring configuration of the corresponding volume, the probability, and wherein the neighbouring configuration corresponds to a pattern of occupancy of the neighbouring volumes.

18. The decoder of claim 13, wherein the processor is further configured to execute the instructions to cause the decoder to further select, based on a partial sequence of bits of the respective bit sequence that have already been coded or a neighbouring configuration of the corresponding volume, the probability, and wherein the neighbouring configuration corresponds to a pattern of occupancy of the neighbouring volumes.

19. The decoder of claim 13, wherein the processor is further configured to execute the instructions to cause the decoder to determine the scan order within the corresponding volume so that, from one sub-volume to the next sub-volume in the scan order, the maximum possible number of neighbouring sub-volumes in already coded neighbouring volumes of the corresponding volume does not increase.

20. The decoder of claim 13, wherein the tree structure represents an octree, wherein the processor is further configured to execute the instructions to cause the decoder to decode a flag from the bitstream, and wherein the flag indicates that the probability is to be selected based on the sub-volume neighbour configuration.

* * * * *